US012417382B2

(12) United States Patent
Nair et al.

(10) Patent No.: US 12,417,382 B2
(45) Date of Patent: Sep. 16, 2025

(54) GEOMECHANICS INFORMED MACHINE INTELLIGENCE

(71) Applicants: Chevron U.S.A. Inc., San Ramon, CA (US); Triad National Security, LLC, Los Alamos, NM (US)

(72) Inventors: Rajesh S. Nair, Houston, TX (US); Karim Shafik Zaki, Houston, TX (US); Yan Li, Houston, TX (US); Margaretha Catharina Maria Rijken, Houston, TX (US); Velimir Valentinov Vesselinov, Los Alamos, NM (US)

(73) Assignees: Chevron U.S.A. Inc., San Ramon, CA (US); TRIAD National Security, LLC, Los Alamos, NM (US)

( * ) Notice: Subject to any disclaimer, the term of this patent is extended or adjusted under 35 U.S.C. 154(b) by 1136 days.

(21) Appl. No.: 17/195,755

(22) Filed: Mar. 9, 2021

(65) Prior Publication Data

US 2022/0292338 A1    Sep. 15, 2022

(51) Int. Cl.
*G06F 30/27* (2020.01)
*G06F 30/23* (2020.01)
(Continued)

(52) U.S. Cl.
CPC .............. *G06N 3/08* (2013.01); *G06F 30/23* (2020.01); *G06F 30/27* (2020.01); *G06N 3/04* (2013.01)

(58) Field of Classification Search
CPC ............ G06F 30/27; G06N 3/08; G06N 3/02
See application file for complete search history.

(56) References Cited

U.S. PATENT DOCUMENTS 10,776,718 B2    9/2020  Alexandrov et al.
11,921,256 B2 *  3/2024  Bowden, Jr. ............. G06N 3/02
(Continued)

OTHER PUBLICATIONS

Chen, Yuntian, and Dongxiao Zhang. "Physics-constrained deep learning of geomechanical logs." IEEE Transactions on geoscience and remote sensing 58.8 (2020): 5932-5943. (Year: 2020).*
(Continued)

*Primary Examiner* — David A Hopkins
(74) *Attorney, Agent, or Firm* — King & Spalding LLP

(57) ABSTRACT

A computer implemented method for prediction of geomechanical performance including productivity index decline and completion integrity for a well or a hydrocarbon reservoir using a geomechanics informed machine intelligence (GIMI) algorithm. The method includes running a geomechanical reservoir simulator to generate training datasets for the hydrocarbon reservoir and incorporating physical models and identified variables into the GIMI algorithm. The method further includes training a neural network of the GIMI algorithm by using correlated training datasets that correlate to the physical models to produce a resulting prediction model and performing sensitivity analysis on the resulting prediction model. Additionally, the method includes identifying dominant variables for damage mechanisms through design of experiment statistics and performing history matching and blind test on the resulting prediction model. Lastly, the method includes updating the identified variables and models incorporated into the GIMI algorithm.

9 Claims, 9 Drawing Sheets

(51) Int. Cl.
G06N 3/04 (2023.01)
G06N 3/08 (2023.01)

(56) References Cited

U.S. PATENT DOCUMENTS

| | | | |
|---|---|---|---|
| 2007/0179768 A1* | 8/2007 | Cullick | E21B 43/00 703/10 |
| 2018/0240021 A1 | 8/2018 | Al-Harbi et al. | |
| 2019/0024494 A1* | 1/2019 | Maher | G06N 3/02 |
| 2020/0088897 A1 | 3/2020 | Roy et al. | |
| 2021/0018655 A1* | 1/2021 | Sun | E21B 43/00 |
| 2021/0131261 A1* | 5/2021 | Wang | E21B 49/006 |
| 2021/0389491 A1* | 12/2021 | Maucec | G01V 1/46 |
| 2022/0010678 A1* | 1/2022 | Awan | E21B 49/0875 |

OTHER PUBLICATIONS

Mudunuru, Maruti K., et al. "Physics-informed machine learning for real-time unconventional reservoir management." CEUR Workshop Proceedings. 2020. (Year: 2020).*

Adeyinka, Adeboye, Folarin Olatunde, and Abiodun Bodunrin. "Deepwater Infill Drilling Evaluation Using Experimental Design: The Agbami Case Study." SPE Nigeria Annual International Conference and Exhibition. SPE, 2017. Abstract, pp. 4-5 (Year: 2017).*

Al-Dousari, Mabkhout M., and Ali A. Garrouch. "An artificial neural network model for predicting the recovery performance of surfactant polymer floods." Journal of Petroleum Science and Engineering 109 (2013): 51-62. Abstract, § 2.3 (Year: 2013).*

Bhark, Eric, and Kaveh Dehghani. "Assisted history matching benchmarking: Design of experiments-based techniques." SPE Annual Technical Conference and Exhibition., 2014. Abstract, pp. 2-5 (Year: 2014).*

Chai, Zhi, et al. "An integrated closed-loop solution to assisted history matching and field optimization with machine learning techniques." Journal of Petroleum Science and Engineering 198 (2020): 108204. Abstract, §§ 1-2 (Year: 2020).*

Chang, Oliver, et al. "Application of machine learning in transient surveillance in a deep-water oil field." SPE Western Regional Meeting. SPE, 2019. Abstract, pp. 10-12 (Year: 2019).*

Côrte, Gustavo, et al. "Deep neural network application for 4D seismic inversion to changes in pressure and saturation: Optimizing the use of synthetic training datasets." Geophysical Prospecting 68.7 (2020): 2164-2185. Abstract, pp. 2166, 2170-2172 (Year: 2020).*

Van Doren, Jorn, et al. "A comprehensive workflow for assisted history matching applied to a complex mature reservoir." SPE Europec featured at EAGE Conference and Exhibition?. SPE, 2012. Abstract, pp. 1-2, 6 (Year: 2012).*

Fabbri, Andrea G., and Chang-Jo Chung. "On blind tests and spatial prediction models." Progress in geomathematics (2008): 315-332. Abstract, p. 4 (Year: 2008).*

Fraces, Cedric G., Adrien Papaioannou, and Hamdi Tchelepi. "Physics informed deep learning for transport in porous media. Buckley Leverett problem." arXiv preprint arXiv:2001.05172 (2020). Abstract, pp. 1-3 (Year: 2020).*

Han, Jiahang, John Yilin Wang, and Virendra Puri. "A fully coupled geomechanics and fluid flow model for proppant pack failure and fracture conductivity damage analysis." SPE Hydraulic Fracturing Technology Conference and Exhibition. SPE, 2014. Abstract, § 1 (Year: 2014).*

Hazan, Tamir, and Tommi Jaakkola. "Steps toward deep kernel methods from infinite neural networks." arXiv preprint arXiv:1508.05133 (2015). Abstract, §§ 1-2 (Year: 2015).*

He, QiZhi, et al. "Physics-informed neural networks for multiphysics data assimilation with application to subsurface transport." Advances in Water Resources 141 (2020): 103610. Abstract, pp. 1-4, 8, 13 (Year: 2020).*

Jin, Zhaoyang Larry, Yimin Liu, and Louis J. Durlofsky. "Deep-learning-based surrogate model for reservoir simulation with time-varying well controls." Journal of Petroleum Science and Engineering 192 (2020): 107273. Abstract, pp. 1-3 (Year: 2020).*

Kumar, Abhishek, Syahrir Ridha, and Suhaib Umer Ilyas. "Unsupervised Deep Learning Algorithm to Solve Sub-Surface Dynamics for Petroleum Engineering Applications." 2020 International Conference on Computational Intelligence (ICCI). IEEE, 2020. Abstract, §§I-II (Year: 2020).*

Lagaris, Isaac E., Aristidis Likas, and Dimitrios I. Fotiadis. "Artificial neural networks for solving ordinary and partial differential equations." IEEE transactions on neural networks 9.5 (1998): 987-1000. Abstract, §§ I-II and V (Year: 1998).*

Millikan, C. V., and Herbert F. Beardmore. "Significance of Declining Productivity Index." Transactions of the AIME 160.01 (1945): 248-257. Abstract, pp. 248-250 (Year: 1945).*

Pan, Yuewei. Production Data Analysis and Production Forecasting for Unconventional Reservoirs Using Machine Learning Algorithms. Diss. 2019. Texas A&M University. Pages iii, 8-9, 18, and 36 (Year: 2019).*

Popa, Alexandru Petrut. "Optimizing Spacing and Fracture Dimensions for Horizontal Wells in a Tight Carbonate Formation with the Help of Numerical Simulation." (2017). Master's Thesis, Montan Leoben University. Pages 6, 48-52 (Year: 2017).*

Su, Hong-Te, et al. "Integrating neural networks with first principles models for dynamic modeling." Dynamics and Control of Chemical Reactors, Distillation cols. and Batch Processes. Pergamon, 1993. 327-332. Abstract, pp. 327-328 (Year: 1993).*

Tartakovsky, Alexandre M., et al. "Learning parameters and constitutive relationships with physics informed deep neural networks." arXiv preprint arXiv:1808.03398 (2018). Abstract, §§ 1-2 (Year: 2018).*

Willard, Jared, et al. "Integrating physics-based modeling with machine learning: A survey." arXiv preprint arXiv:2003.04919 1.1 (2020): 1-34. Abstract, §§ 1-3 (Year: 2020).*

Maruti Mudunuru, YouTube Video "Physics-Informed Machine Learning for Real-time Reservoir Management by Maruti Mudunuru", Mar. 30, 2020, URL: www(dot)youtube(dot)com/watch?v=pG4WzgOlqBk—see the video description (Year: 2020).*

Minkoff, Susan E., et al. "Coupled fluid flow and geomechanical deformation modeling." Journal of Petroleum Science and Engineering 38.1-2 (2003): 37-56. (Year: 2003).*

Ayensa-Jiménez, Jacobo, et al. "Identification of state functions by physically-guided neural networks with physically-meaningful internal layers." arXiv preprint arXiv:2011.08567 (2020) (Year: 2020).*

Liu, Hui-Hai, et al. "Incorporation of physics into machine learning for production prediction from unconventional reservoirs: A brief review of the gray-box approach." SPE Reservoir Evaluation & Engineering 24.04 (2021): 847-858 (Year: 2021).*

Daw, Arka, et al. "Physics-Guided Architecture (PGA) of Neural Networks for Quantifying Uncertainty in Lake Temperature Modeling." arXiv preprint arXiv:1911.02682. Nov. 6, 2019 (Year: 2019).*

Muralidhar, Nikhil, et al. "Phynet: Physics guided neural networks for particle drag force prediction in assembly." Proceedings of the 2020 SIAM international conference on data mining. Society for Industrial and Applied Mathematics, 2020 (Year: 2020).*

Liu, H. H., et al. "A physics-constrained machine learning (PCML) method for predicting production from unconventional reservoirs: an introduction." AGU Fall Meeting Abstracts. vol. 2020. 2020. (Year: 2020).*

Li, Y., Zaki, K., Tan, Y., Wu, R., Rijken, P., "Productivity Decline: Improved Production Forecasting Through Accurate Representation of Well Damage", SPE-196213-MS, 2019, pp. 1-13, Society of Petroleum Engineers.

Tan, Y., Li, Y., Wu, R., Rijken, P., Zaki, K., Karazincir, O., Williams, W., Wang, B. "Modeling of Production Decline Caused by Fines Migration in Deep Water Reservoirs", 187263-PA SPE Journal Paper, 2020, pp. 391-405, Society of Petroleum Engineers.

Zaki, K., Li, Y., & Terry, C. "Assessing the Impact of Open Hole Gravel Pack Completions to Remediate the Observed Productivity Decline in Cased Hole FracPack Completions in Deepwater Gulf of Mexico Fields", SPE 191731-MS, 2018, pp. 1-18, Society of Petroleum Engineers.

(56) References Cited

OTHER PUBLICATIONS

Zaki, K., Li, Y., Tan, Y., Wu, R., Rijken, P., "Productivity Decline: The Underlying Geomechanics and Contributing Damage Factors", SPE-196223-MS, 2019, pp. 1-16, Society of Petroleum Engineers.

Vesselinov, V.V., Mudunuru, M., Karra, S., O'Malley, D., Alexandrov, B.S., Unsupervised Machine Learning Based on Non-Negative Tensor Factorization for Analyzing Reactive-Mixing, Journal of Computational Physics, 395 (2019), pp. 85-104, Elsevier Inc., https://doi.org/10.1016/j.jcp.2019.05.039.

Vesselinov, V.V., Alexandrov, B.S., O'Malley, D., Nonnegative Tensor Factorization for Contaminant Source Identification, Journal of Contaminant Hydrology, 2018, pp. 1-32, Elsevier Inc., https://doi.org/10.1016/j.iconhyd.2018.11.010.

* cited by examiner

GEOMECHANICS INFORMED MACHINE INTELLIGENCE

STATEMENT REGARDING FEDERAL RIGHTS

The United States government has certain rights in this invention pursuant to Contract No. 89233218CNA000001 between the United States Department of Energy and TRIAD National Security, LLC for the operation of Los Alamos National Laboratory.

PARTIES TO JOINT RESEARCH AGREEMENT

The research work described here was performed under a Cooperative Research and Development Agreement (CRADA) between Los Alamos National Laboratory (LANL) and Chevron under the LANL-Chevron Alliance, CRADA number LA05C10518.

TECHNICAL FIELD

The present disclosure relates generally to prediction of geomechanical performance of a well or a hydrocarbon reservoir.

BACKGROUND

Geomechanics is usually utilized in supporting oil and gas reservoir analysis and well operations to facilitate safe, reliable and efficient recovery of hydrocarbons. To account for the response of subsurface formations to engineered changes, naturally occurring geological variations, and uncertainties, geomechanics models are usually complex and subsequently computationally intensive. These issues hinder deploying of advanced geomechanics solutions as optimized engineering solutions and decision making tools in the oil and gas industry.

Moreover, supervised machine learning (ML) approaches based solely on data are traditionally used for the aforementioned oil and gas reservoir performance analysis. These approaches, however, are difficult to interpret, data-hungry, slow to train, prone to over/under-fitting, and have lower predictive certainty. Additionally, these supervised ML approaches are also heavily impacted by the presence of any noise in the training data.

Therefore, improved techniques for using machine learning in the geomechanical modeling of oil and gas reservoirs and well operations would be beneficial.

SUMMARY

The present disclosure relates generally to computer implemented methods for predicting geomechanical performance of wells and hydrocarbon reservoirs using a physics-informed machine learning technique. One example includes a computer implemented method for prediction of productivity index decline for a well or a hydrocarbon reservoir using a geomechanics informed machine intelligence (GIMI) algorithm. In an example embodiment, the method includes running a geomechanical reservoir simulator to generate training datasets for the hydrocarbon reservoir and incorporating physical models and identified variables into the GIMI algorithm. The method also includes training a neural network of the GIMI algorithm by using correlated training datasets that correlate to the physical models to produce a resulting prediction model, wherein the correlated training datasets are a subset of the training datasets. In addition, the method includes performing sensitivity analysis on the resulting prediction model and identifying dominant variables for damage mechanisms through design of experiment (DOE), wherein the damage mechanisms relate to the productivity index decline for the hydrocarbon reservoir. Further, the method includes performing history matching and blind test on the resulting prediction model. Lastly, the method includes updating, based on an accuracy of the prediction of productivity index decline being less than a threshold value, the identified variables and models incorporated into the GIMI algorithm.

In another example embodiment, a computer implemented method for predicting integrity of a well completion using the GIMI algorithm includes running a finite element scale model for the well completion using geologic data and well log data to generate well completion training data. The method also includes training the GIMI algorithm using the well completion training data and running a finite element analysis (FEA) simulation for hardware used in the well completion to generate the hardware training data. In addition, the method includes training the GIMI algorithm using the hardware training data and physical models for the hardware and running a finite element near-wellbore scale model to generate training data for conditions surrounding the well completion. Further, the method includes training the GIMI algorithm using the training data for conditions surrounding the well completion and running the GIMI algorithm to predict failure in the hardware used in the well completion.

In another example embodiment, a computer implemented method for prediction of integrity of well completion hardware using the GIMI algorithm includes developing a finite element completion scale model using geological and well log data, field measurements, fracture geometry and laboratory measurements on rock samples. The method also includes training a neural network of the GIMI algorithm to generate stress, pore pressure and displacement distributions based on finite element simulations. The method includes finite element model simulations of laboratory tests of pipe buckling and collapse, generating stress distribution and deformation patterns for different loading conditions, and training a machine learning algorithm within the GIMI framework to predict the deformation patterns and to recognize pipe failure. The method further includes running a near-wellbore scale model for a range of bottomhole pressure and in-situ conditions, training a neural network of the GIMI algorithm to generate stress and deformation patterns in the near-wellbore formation and in the completion hardware (pipe). The method includes using the trained machine learning algorithms within GIMI to predict failure in the completion hardware over a range of likely occurring in-situ and operating conditions over life of the well.

In another example embodiment, a computer implemented method for predicting a geomechanical characteristic of a hydrocarbon reservoir using the GIMI algorithm includes running a geomechanical reservoir simulator to generate training data and incorporating physical models and identified variables into the GIMI algorithm. In addition, the method includes training a neural network of the GIMI algorithm by using correlated training data that correlates to the physical models to produce a resulting prediction model and performing sensitivity analysis and history matching on the resulting prediction model. Further, the method includes predicting the geomechanical characteristic of the hydrocarbon reservoir using the resulting prediction model and evaluating an accuracy of the geomechanical characteristic predicted using the resulting prediction model. Lastly, the method includes updating the physical models based on the accuracy.

These and other aspects, objects, features, and embodiments will be apparent from the following description and the appended claims. The foregoing summary is provided to introduce various concepts in a simplified form that are further described below in the detailed description. This summary is not intended to identify required or essential features of the claimed subject matter nor is the summary intended to limit the scope of the claimed subject matter.

BRIEF DESCRIPTION OF THE DRAWINGS

Reference will now be made to the accompanying drawings, which are not necessarily drawn to scale, and wherein.

Figure 1:
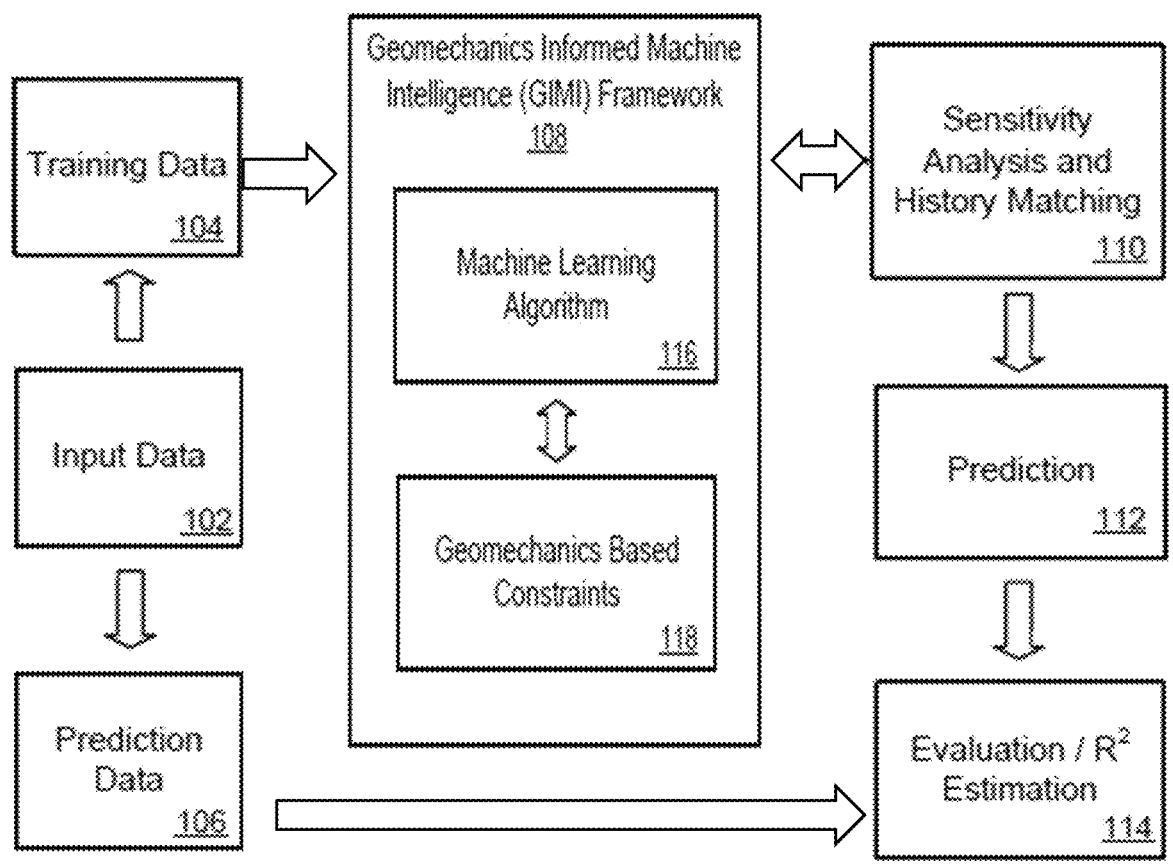
FIG. 1 is an example work flow of geomechanical performance prediction by the GIMI algorithm.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION OF EXAMPLE EMBODIMENTS

In the following paragraphs, particular embodiments will be described in further detail by way of example with reference to the drawings. In the description, well-known components, methods, and/or processing techniques are omitted or briefly described. Furthermore, reference to various feature(s) of the embodiments is not to suggest that all embodiments must include the referenced feature(s).

In contrast to the machine learning based modeling techniques of the prior art, unsupervised and physics-informed ML approaches may overcome the issues associated with the traditional ML approaches in that the unsupervised ML approaches rely on data with physical meaning associated with the reservoir. Further, the physics-informed ML approaches allow for implementing additional physics information in the ML algorithms in the form of constraints, constitutive relationships, and even actual physics models. A GIMI algorithm based on unsupervised and physics-informed ML techniques may be desirable for performance analysis such as the prediction of geomechanical properties for hydrocarbon reservoirs. This GIMI algorithm may bring in reduced computational cycle time, improved decision quality, and accelerated business decisions related to energy extraction for the oil and gas industry.

Advances in ML have been leveraged to develop a unique GIMI approach for hydrocarbon reservoir geomechanical performance prediction with improved solution speed while solving complex geomechanics problems. In this GIMI approach, a ML algorithm is embedded with physics constraints based on geomechanics principles that help focus the algorithm's learning, thereby producing an improved neural network. These constraints may be in the form of fluid transport laws (e.g., Darcy's law), constitutive relationships (e.g., stress-strain laws), balance equations (e.g., mass/momentum/energy conservation), and partial differential equations (PDE) models (e.g., PDE solvers of flow, geomechanics, deformation, etc). This results in a more accurate prediction of geomechanics response of a reservoir to engineered changes at the well. As a physics-informed machine learning algorithm, the GIMI approach has been shown to be less data-hungry, easier to train, less prone to common ML issues such as over/under-fitting, and lower predictive uncertainty.

In one example embodiment, this GIMI approach has been applied in predicting the productivity index decline of a deep water well. A series of simulations with different model inputs were conducted and a portion of the results have been used as a training dataset for a ML algorithm. In the productivity index decline study, intermediate variables generated based on geomechanics principles are embedded into the GIMI algorithm to optimize its learning process. Results obtained so far have shown that the GIMI algorithm produces a more accurate estimation of productivity index decline curves over time (with $r^2$>95%) even though the size of the training dataset for the GIMI algorithm is smaller than that of traditional ML algorithms.

Turning now to the drawings, FIG. 1 illustrates an example work flow 100 of geomechanical performance prediction by the GIMI algorithm. The work flow 100 is configured to provide training data 104 to the GIMI framework 108 for training the ML algorithm therein to generate prediction models for geomechanical performance prediction. The resulting prediction model from GIMI framework 108 is further provided for sensitivity analysis and history matching 110 under various operating conditions of the reservoir. Further, results of prediction 112 are fed back to the GIMI framework 108 in order to optimize the GIMI algorithm to improve its accuracy for the prediction. This work flow 100 also includes providing prediction data 106 to the trained GIMI approach to evaluate the accuracy of the resulting geomechanics prediction model by comparing the results of prediction 112 generated from the prediction model and the prediction data 106.

In an example embodiment, the work flow 100 includes inputting data 102 for the prediction of geomechanical performance. The input data may be field data collected from operation history of the oil and gas reservoirs. In addition, the input data may be pulled from laboratory data, operation log data, or completion data that reveals heterogeneity of the hydrocarbon reservoirs. Specifically, the input data may correspond to the contents of a single database table, or a single statistical data matrix that reveals geomechanical properties of the reservoirs, where each column of the table represents a particular variable, and each row corresponds to a given member or value corresponding to the variable. Here, a training dataset 104 is sent to the GIMI framework 108 to train the ML algorithm 116 for geomechanical performance prediction. The training dataset 104 is the one used to train the ML algorithm 116 in understanding how the hydrocarbon reservoir operates and performs, and in applying relevant concepts to a neural network of the ML algorithm 116 to learn and produce results accordingly. In this example, the work flow 100 also includes providing prediction dataset 106 which is used to evaluate how well the GIMI framework 108 is trained based on the training dataset 104. Here, the prediction dataset 106 may be derived by utilizing a coupled geomechanics and fluid flow model that historically matches to and forecasts the performance of the wells and the hydrocarbon reservoirs. The training data and the prediction data may represent 80% and 20% of the overall input data 102, respectively.

In an example embodiment, the work flow 100 includes the GIMI framework 108 that is configured to generate geomechanical performance prediction models for the oil and gas reservoirs. As shown in FIG. 1, the GIMI framework 108 includes the ML algorithm 116 and geomechanics based constraints 118 that are applied to the ML algorithm 116. In this example, the ML algorithm 116 may be an unsupervised ML approach that takes training dataset only as inputs. The unsupervised learning algorithm further finds structures in the training dataset and groups or clusters the input data points. The unsupervised learning algorithm learns from the training dataset that has not been labeled or categorized and identifies commonalities in the training data based on the presence of commonalities shown in the training data. In other example embodiments, the ML algorithm 116 may include a supervised learning approach that builds a mathematical model of a set of variables containing both the inputs and desired outputs. Through the training of the model, the supervised learning algorithm learns a function that can be used to predict the output associated with the input variables. The supervised learning algorithm is continuously trained until achieving improved accuracy of outputs or predictions over time. The ML algorithm 116 shown in FIG. 1 may use a neural network to analyze the input training data 104. The neural network may include an input layer and an output layer, as well as multiple intermediate hidden layers.

In an example embodiment, the geomechanics based constraints 118 are provided in the GIMI framework 108 as inputs to the ML algorithm 116 to improve the geomechanical performance prediction accuracy from the GIMI framework 108. Various geomechanics principles and constraints may be available from the hydrocarbon reservoirs and can be input as additional limitations for training the ML algorithm 116. For example, geomechanics principles related to compaction, creep, fracture conductivity, proppant embedment, and fluid invasion can be used as additional constraints to the input training data and principles of data fitting and propagation in the neural network of the ML algorithm 116. Specifically, geomechanics principles, e.g., flow and transport principles and equilibrium principles can be applied to input variables of the training data 104 to generate intermediate variables with regulated properties and date ranges for training of one or more intermediate layers of the neural network of the ML algorithm 116. A more detailed description of the neural network for the ML algorithm training and applying the geomechanics based constraints to the ML algorithm will be provided in FIGS. 3 and 4.

In an example embodiment, the GIMI framework 108 generates a prediction model through training of the ML algorithm 116. For example, the GIMI framework 108 is trained to generate a physical model for predicting productivity index decline of a hydrocarbon reservoir. In another example, the GIMI framework 108 may be trained to build a model to capture a near wellbore completion geometry. A fully trained geomechanics model can be used to simulate various geomechanical properties or damage mechanisms during production of the reservoir. In the workflow 100, the resulting prediction model is further linked for sensitivity analysis and history matching 110. The sensitivity analysis and history matching 110 are conducted by using partial input data, e.g., historical field data from the reservoir. After generating a prediction model from the GIMI framework 108, a response surface is created and used for the history matching. Once the resulting prediction model matches to the history data, the prediction model is rerun to replicate the prediction history match results in order to validate any high nonlinearity between the input variables and the resulting prediction models. The sensitivity analysis and history matching process 110 may iterate when the history matching results are not satisfied. In such cases, the ML algorithms and neural network models in the GIMI framework 108 may need to be reviewed and redesigned until the results of the resulting prediction models successfully match the field data of the reservoir. Through the procedure of sensitivity analysis and history matching 110, the resulting prediction models generate appropriate variable ranges and representative damage mechanisms and are ready for geomechanical performance prediction 112. Here, it is possible to identify dominant variables that have bigger impact on predicting geomechanical performance of the reservoir through analyzing the history matched results and input variables to the prediction models. In the step of prediction 112, the resulting prediction model can be run with different operation constraints, stimulations or other remediation strategies related to the reservoir. This helps the asset team to make decisions on adjusting operation conditions of the reservoir to optimize the production of the reservoir.

In an example embodiment, the work flow 100 includes an evaluation step 114 to estimate prediction accuracies of various resulting prediction models generated from the GIMI framework 108. In this example, prediction data 106 are input to various prediction models and their R-squared ($r^2$) statistics values are calculated, respectively. The calculated $r^2$ statistics values present a variety of "goodness-of-fit" statistics of the prediction models to the prediction data 106. In general, the $r^2$ statistics value is between 0 to 1, and a higher $r^2$ value indicates a better fitting between the prediction model and the prediction data 106.

Figure 2:
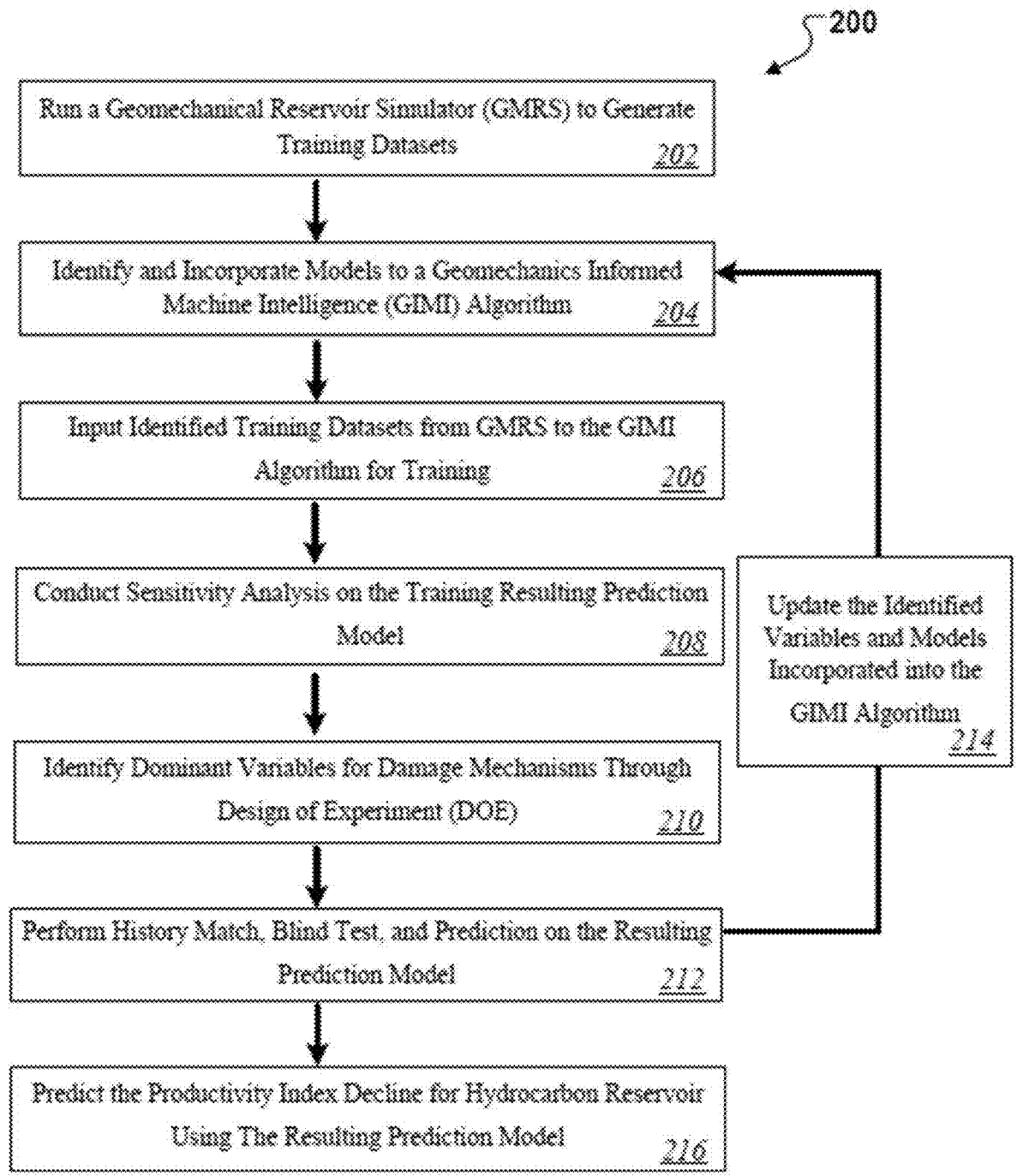
FIG. 2 is an example method flow for predicting the productivity index decline through the GIMI algorithm.

FIG. 2 is an example method flow 200 for predicting geomechanical performance, e.g., the productivity index decline of the reservoir, through the GIMI algorithm. Referring to FIG. 1 and in an example embodiment, the method 200 includes running a geomechanical reservoir simulator (GMRS) to generate training datasets for the hydrocarbon reservoir geomechanical performance prediction, at 202. For example, the GMRS can be configured to model the productivity index decline of the reservoir and generate training dataset 104 that is input to the GIMI framework 108 for training of the ML algorithm 116. Here, the GMRS may be a customized optimization tool to simulate geomechanical properties, such as explicit wellbore, permeability and porosity damage to the hydrocarbon reservoir. The GMRS tool may be linked with a database that stores historical field data of the reservoir and selects training data 104 for optimizing the ML algorithm 116 of the GIMI framework 108.

The method 200 also includes incorporating physical models and identified variables into the GIMI algorithm, at 204. For example, specific geomechanics models and input variables that are correlated to the target geomechanical properties may be selected and incorporated into the ML algorithm 116 for training. In this step, the models may be coupled flow and geomechanics physics models that are generated by the GMRS tool. These models may be configured to represent production of the hydrocarbon reservoir and reveal the productivity index decline through modifying material properties in each component of the geomechanics physics model and simulating production subject to different damage mechanisms independently and explicitly. To predict the productivity index decline, the geomechanics physics models may be validated for various types of completions including open hole, fracture, and cased hole wells. In this example embodiment, the identified variables for productivity index decline prediction may include porosity, Young's Modulus, poisson's ratio, creep percentage, well azimuth, well deviation, unconfined compressive strength, friction angle, net pressure, fracture length, proportion of damaged pack, permeability reduction rate, residual permeability multiplier, critical velocity, and minimum perforation efficiency. Each of the aforementioned input variables are presented in scale as input to the GIMI framework 108 for training.

The method 200 further includes training a neural network of the GIMI algorithm by using correlated training datasets that correlate to the physical models to produce a resulting prediction model, wherein the correlated training datasets are a subset of the training datasets, at 206. For example, the geomechanics physical models generated by the GMRS and training datasets which include variables that are correlated to the generated geomechanics physical models are input to the ML algorithm 116 for training. The training may be conducted in a neural network that includes multiple layers. The training dataset may be input to an initial layer of the neural network for the training. As discussed in FIG. 1, geomechanics based constraints are applied to the ML algorithm 116 for the training in the form of incorporating intermediate variables to one or more intermediate layers of the neural network during the training. The intermediate variables may be generated by applying geomechanics principles to the identified variables of the training dataset. Moreover, the training of the ML algorithm 116 may be conducted based on a combination of the identified variables and the intermediate variables applied on the initial layer and one or more intermediate layers of the neural network of the ML algorithm, respectively. More detailed description regarding the training of the ML algorithm and applying the intermediate variables to the neural network of the ML algorithm for training is further provided in the FIG. 5 workflow.

In addition, the method 200 includes performing sensitivity analysis on the resulting prediction model and identifying dominant variables for damage mechanisms through DOE statistics, wherein the damage mechanisms relate to the productivity index decline for the hydrocarbon reservoir, at 208 and 210. In this example, the sensitivity analysis is a procedure configured to examine what impact each feature of the prediction model has on predicting geomechanical performance. To calculate the sensitivities, some feature values of the prediction model are changed while some other feature values stay constant. By changing some feature values of the prediction model, the output of the model may be altered drastically. These features of the resulting prediction model are thus identified to have big impact to the geomechanical performance prediction. In this example, the method 200 further models different damage mechanisms to determine dominant variables of the training dataset. Specifically, the damage mechanisms identified behind the productivity index decline of the hydrocarbon reservoir may include off-plane perforation contribution and stability, fracture connectivity and tortuosity, drilling and completion fluids invasion, creep and compaction effects, fracture conductivity, fines migration and trapping, and non-Darcy flow effects. Identifying proper damage mechanisms plays an important role in predicting the geomechanical properties of the reservoir and it can be done through DOE statistics. For example, different variables of the training data 104 including lab test data, well completion data, reservoir properties, rock properties, and field operational data can be incorporated into a DOE matrix. Each of the variables is related to one or several damage mechanisms described above. After generating the DOE and running the resulting prediction model with the identified variables, a response surface is generated for history matching and blind test afterward.

The method 200 also includes performing history matching, blind test, and prediction based on the resulting prediction model, at 212. In this example, the history matching may be conducted by comparison of field data of the hydrocarbon reservoir and the response results of the DOE matrix and resulting prediction model. Proxies may be needed to reduce the history matching time. Once the response results of the resulting prediction model match the history data, the resulting prediction model is rerun to replicate the history matching result to validate a possible high nonlinearity between the input training datasets and the response results of the resulting prediction model. By analyzing the history matching results, it is possible to identify input variables that have bigger impact to the geomechanical properties of the reservoir and the damage mechanisms that are dominant in the performance of the reservoir. Further, the blind test is performed to run the history matched prediction model and to compare its results with additional field data of the hydrocarbon reservoir. If the results match to the additional field data, the method 200 moves to the step of prediction 112. If not, the method 200 further performs updating, based on an accuracy of the prediction of productivity index decline being less than a threshold value, of the identified variables and models incorporated into the GIMI algorithm, at 214. Here, the geomechanics physical models, the identified variables, as well as the DOE matrix need to be reviewed and updated for repeating of the steps 204 to 212. These procedures iterate until the resulting prediction model passes the blind test and is validated.

Lastly, the method 200 includes predicting geomechanical performance of the hydrocarbon reservoir by using the resulting prediction model, at 216. In this example embodiment, the method 200 predicts productivity index decline of the hydrocarbon reservoir using the resulting prediction model. In this step, the resulting prediction model generated by the GIMI algorithm can be run with different operation constraints, stimulations, and strategies. An asset team of the hydrocarbon reservoir is able to predict the productivity index decline based on various conditions of the production and adjust operation conditions to meet a targeted productivity of the reservoir, accordingly.

Figure 3:
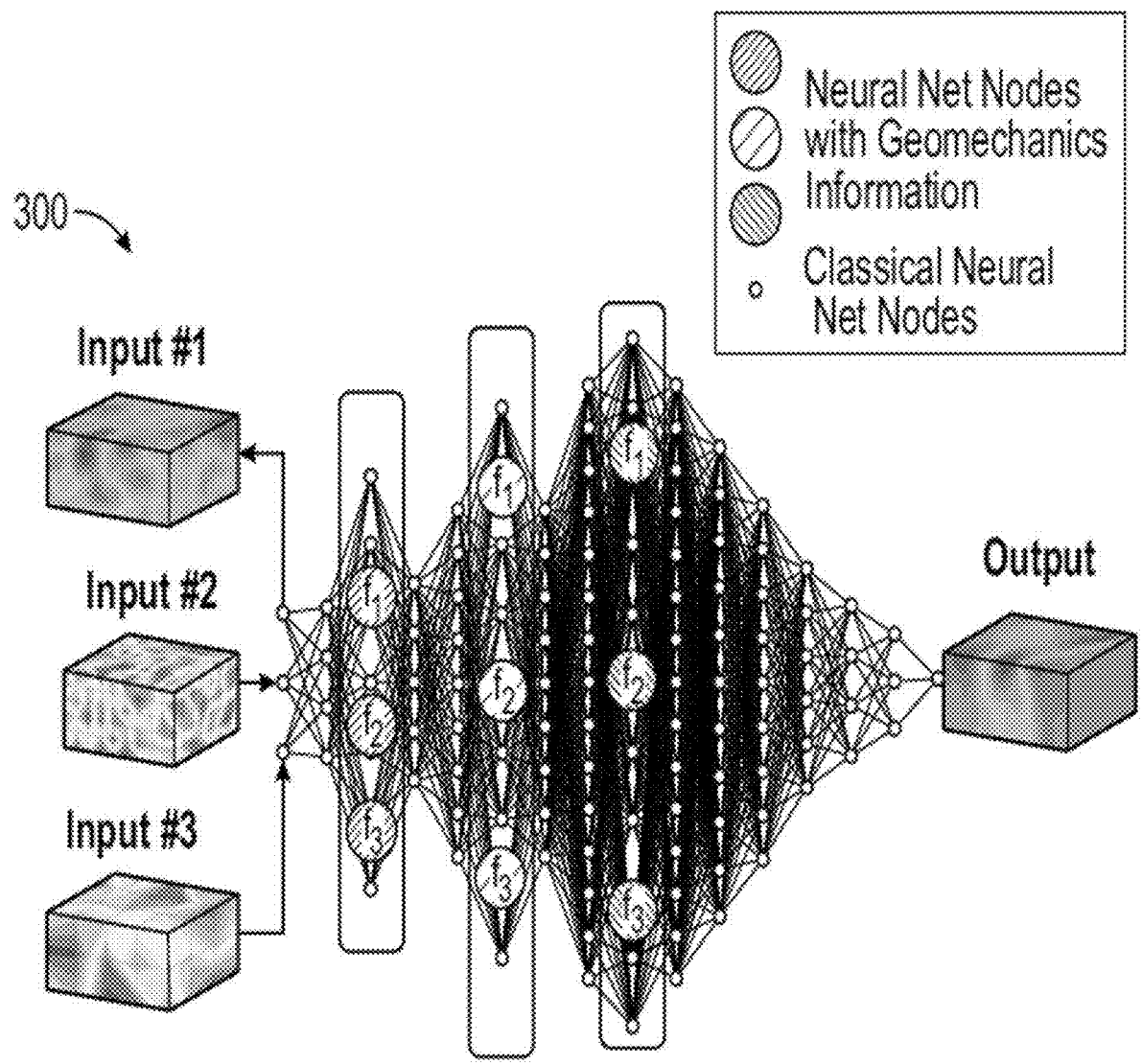
FIG. 3 is an example neural network for geomechanical performance prediction in the GIMI framework.

FIG. 3 is an example neural network 300 for geomechanical performance prediction through the GIMI framework described in FIG. 1. This neural network 300 provides an example of neural network that has been enhanced with geomechanics information for predicting geomechanical performance, e.g., the productivity index decline of the hydrocarbon reservoir. As discussed earlier in FIG. 1, the ML algorithm 116 is trained through the neural network 300 to determine the best set of weights of each layer therein for enhancing a neural network's prediction performance. The neural network 300 can be trained without knowing precisely how training data propagates through from the initial layers to a last layer of the neural network. The number of nodes in each layer and the number of total neural net layers depend on a complexity of the geomechanical performance prediction model.

As shown in the neural network 300 of FIG. 3, classical neural net nodes are represented by small circles and large neural net nodes containing geomechanics information are represented by large circles. At the initial neural network layer, various training datasets input #1, input #2, and input #3 are input to different neural net nodes of the initial layer. The input training datasets may be field data of the reservoir in different scales. For example, the input training data to the neural network 300 may include porosity, Young's Modulus, poisson's ratio, creep percentage, well azimuth, well deviation, unconfined compressive strength, friction angle, net pressure, fracture length, proportion of damaged pack, permeability reduction rate, residual permeability multiplier, critical velocity, and minimum perforation efficiency.

In an example embodiment, the training data inputs are propagated through the neural network layers. In this GIMI framework neural network 300, geomechanics information and constraints are further embedded therein. Specifically, geomechanics constraints, constitutive laws, or material models may be incorporated to specific neural net layers. As shown in FIG. 3, the example large neural net nodes in the third, sixth, and ninth neural layer have geomechanics information incorporated. The large neural net nodes indicate geomechanics information and constraints in different scales are applied therein. In contrast, the small circle neural net nodes are classical neural net nodes that only contain data. In this example, the neural network 300 may incorporate supervised ML algorithm or unsupervised ML algorithm for prediction of geomechanical performance of the hydrocarbon reservoir.

Figure 4:
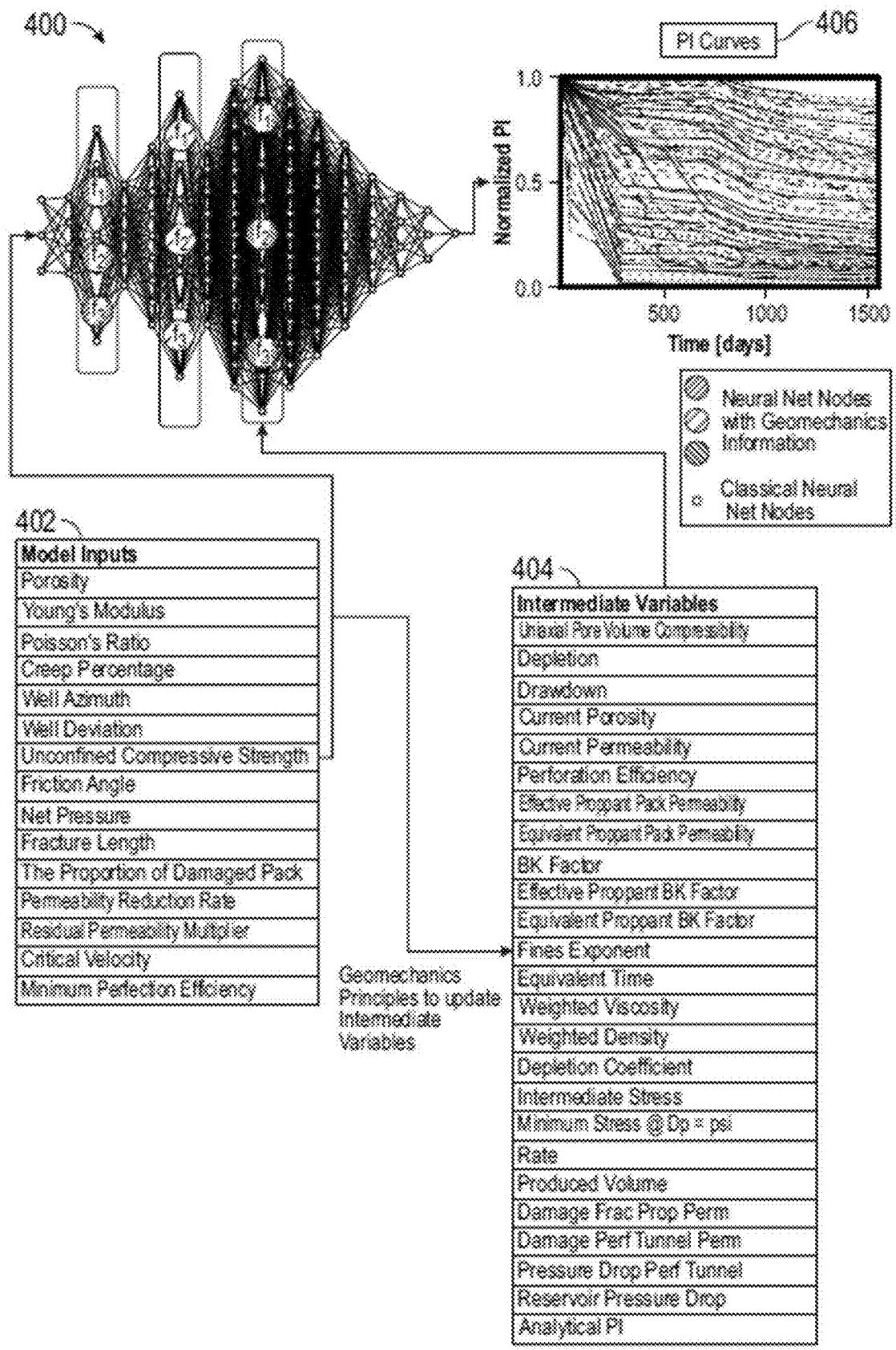
FIG. 4 is an example of geomechanical performance prediction by introducing a combination of identified variables and intermediate variables to the classic neural network in the GIMI framework.

FIG. 4 is an example of geomechanical performance prediction flow 400 that incorporates a combination of identified variables and intermediate variables into the neural network resulting in improved neural network 300 of the GIMI framework 108. In an example embodiment, the neural network 300 is trained based on a combination of the identified variables/model input 402 and intermediate variables 404. The identified variables 402 may be selected from field data of the reservoir or generated from a GMRS tool. In general, the identified variables 402 are input to the initial layer of the neural network 300. Additionally, intermediate variables 404 are input to at least one of the intermediate layers of the neural network 300 in a form of geomechanics constraints incorporated into the large circle neural net nodes that contain geomechanics information.

In an example embodiment, the intermediate variables 404 are generated by applying geomechanics principles to the identified variables 402. The generated intermediate variables may include additional parameters that are different from the identified variables 402 and in different ranges. As describes earlier in FIGS. 1 and 2, the identified variables relate to the selected geomechanics models that are correlated to the target geomechanical properties or variables generated from the GMRS simulation. In an example embodiment, the training of the GIMI framework 108 may incorporate a total of more than 500 combinations of identified variables and intermediated variables. Accordingly, the predicted geomechanical performance, e.g., the productivity index decline, are simulated for each combination of the identified variables and intermediate variables by using the GMRS tool. FIG. 4 shows an example of calculated normalized productivity index curves 406 as a function of forecast days. In this plotting, the normalization is done against the highest productivity index value calculated for each combination of the identified variables and intermediate variables. Specifically, eight snapshots of predicted productivity index decline are shown in the 406 plotting, including the $1^{st}$, $38^{th}$, $290^{th}$, $487^{th}$, $727^{th}$, $923^{rd}$, $1162^{nd}$, and $1552^{nd}$ days after initiation of oil production in the hydrocarbon reservoir.

In some example embodiments, a flow and transport principle may be applied on the identified variables 402 to generate intermediate variables 404 that are incorporated into one or more intermediate layers of the neural network 300. The flow and transport principle includes Darcy's law for two phase immiscible flow reproduced below:

$$U_\alpha = -\frac{Kk_{r\alpha}}{\mu_\alpha} \cdot (\nabla p_\alpha - \rho_\alpha g \nabla D), \alpha = w, o \tag{1}$$

$$\frac{\partial}{\partial t}(\phi \rho_\alpha S_\alpha) = -\nabla \cdot (\rho_\alpha U_\alpha) + q_\alpha, \alpha = w, o$$

$$S_o + S_w = 1$$

$$p_c = p_o - p_w$$

The flow and transport principle also includes Non-Darcy's law and Forchheimer's equation reproduced below:

$$\left(I + \beta \rho_\alpha |U_\alpha| \frac{Kk_{r\alpha}}{\mu_\alpha}\right) U_\alpha = -\frac{Kk_{r\alpha}}{\mu_\alpha} \cdot (\nabla p_\alpha - \rho_\alpha g \nabla D), \alpha = w, o \tag{2}$$

$$|U_\alpha| = \sqrt{U_{\alpha,x}^2 + U_{\alpha,y}^2 + U_{\alpha,z}^2}$$

In addition, the flow and transport principle includes GMRS Non-Darcy's equation reproduced below:

$$\left(I + \beta_K \rho_\alpha |U_\alpha| \frac{k_{r\alpha}}{\mu_\alpha}\right) U_\alpha = -\frac{Kk_{r\alpha}}{\mu_\alpha} \cdot (\nabla p_\alpha - \rho_\alpha g \nabla D), \alpha = w, o \tag{3}$$

$$\beta_K = \begin{vmatrix} \beta K_x & & \\ & \beta K_y & \\ & & \beta K_z \end{vmatrix}$$

Further, the flow and transport principle includes rock compressibility equation, fluid compressibility equation, and total compressibility equation that are respectively reproduced below:

$$c_R = \frac{1}{\phi}\frac{d\phi}{dp}, \phi = \phi^0\left(1 + c_R(p - p^0)\right) \tag{4}$$

$$c_f = \frac{1}{\rho}\frac{d\rho}{dp}, \rho = \rho^0\left(1 + c_f(p - p^0)\right) \tag{5}$$

$$c_t = c_f + \frac{\phi^0}{\phi}c_R \tag{6}$$

where in the above equations (1) to (6), K is permeability, $\emptyset$ is porosity, U$\alpha$ is flow velocity, $p_\alpha$ is fluid pressure, $\rho_\alpha$ is fluid density, $k_{r\alpha}$ is relative perm, $\mu_\alpha$ is viscosity, $S_\alpha$ is saturation, $\beta$ is inertial factor, and $\beta_K$ is GMRS BK factor.

In some example embodiments, an equilibrium principle may be applied on the identified variables 402 to generate intermediate variables 404 that are incorporated into one or more intermediate layers of the neural network 300. The equilibrium principle includes an equilibrium equation of total stress, a strain/displacement equation, and an elastic stress/strain constitutive equation respectively reproduced below:

$$\sigma_{ij,j} + f_i = 0 \quad (7)$$

$$\varepsilon_{ij} = \frac{1}{2}(u_{i,j} + u_{j,i}) \quad (8)$$

$$\sigma_{ij} = C_{ijkl}\epsilon_{ik} - bp\delta_{ij} \quad (9)$$

The above equations (7) to (9) can be included, as an equilibrium principle, in the finite element formulation reproduced below:

$$\int_V \left[ \nabla \left( C \frac{1}{2} (\nabla u + \nabla u^T) + bp \right) + f \right] \cdot u dV = 0 \quad (10)$$

$$[K]\{u\} + [L]\{p\} = \{f\}$$

In addition, the equilibrium principle includes the effective stress equation reproduced below:

$$\sigma_{ij}^e = \sigma_{ij} + bp\delta_{ij} \quad (11)$$

Moreover, the equilibrium principle includes a stress-strain material matrix for elastic isotropic material reproduced below:

$$C = \begin{bmatrix} C_{11} & C_{12} & C_{12} & 0 & 0 & 0 \\ C_{12} & C_{11} & C_{12} & 0 & 0 & 0 \\ C_{12} & C_{12} & C_{11} & 0 & 0 & 0 \\ 0 & 0 & 0 & (C_{11}-C_{12}) & 0 & 0 \\ 0 & 0 & 0 & 0 & (C_{11}-C_{12}) & 0 \\ 0 & 0 & 0 & 0 & 0 & (C_{11}-C_{12}) \end{bmatrix} \quad (12)$$

$$C_{11} = \frac{E(1-\gamma)}{(1+\gamma)(1-2\gamma)},$$

$$C_{12} = \frac{E\gamma}{(1+\gamma)(1-2\gamma)},$$

$$(C_{11} - C_{12}) = \frac{E}{(1+\gamma)}$$

where in the above equations and matrix (7) to (11), $\sigma$ is total stress, $\epsilon$ is volumetric strain, u is displacement, f is body force, p is pore pressure, $\sigma^e$ is effective stress, M is material matrix, E is Young's Modulus, and $\gamma$ is Possion's ratio.

In some example embodiments, a compaction and creep principle may be applied on the identified variables 402 to generate intermediate variables 404 that are incorporated into one or more intermediate layers of the neural network 300. The compaction and creep principle includes equations reproduced below to convert the identified variables to intermediate variables:

$$E_f = (1 - \chi)E \quad (13)$$

$$K = \frac{E_f}{3(1-2v)} \quad (14)$$

$$c_b = \frac{1}{K} \quad (15)$$

$$c_{pp} = \frac{c_b}{\phi_i} \quad (16)$$

$$k_i = a_1.k_b.e^{a_2 \frac{\phi_i}{\phi_b}} \quad (17)$$

$$\beta_F = \frac{b_1}{(k_{DP}/1000)^{b_2}} \quad (18)$$

$$c_{pu} = \frac{c_{pp}(1-v)}{3(1-v)} \quad (19)$$

$$\phi_{DP} = \phi_i(1 - c_{pu}.DP) \quad (20)$$

$$k_{DP} = a_1.k_b.e^{a_2\frac{\phi_{DP}}{\phi_b}} \quad (21)$$

$$PMM = a_1.\frac{k_i}{k_{DP}}.1E6 \quad (22)$$

$$PME = \frac{a_2}{\phi_b} \quad (23)$$

$$BK = \beta_F.k_{DP} \quad (24)$$

where in the above equations (13) to (24), the probabilistic input variables include depletion DP, initial porosity $\Phi_i$, poisson's ratio v, Young's modulus E, creep percentage $\chi$. In addition, the deterministic input variables include base permeability $K_b$, base porosity $\Phi_b$, poro-perm coefficient 1 $a_1$, poro-perm coefficient 2 $a_2$, formation beta factor correlate multiplication $b_1$, and formation beta factor correlate exp $b_2$. Further, the generated intermediate variables by applying the compaction and creep principle on the identified variables include initial permeability $K_i$, effective Young's modulus $E_f$, bulk modulus K, bulk compressibility $c_b$, pore volume compressibility $c_{pp}$, formation beta factor $\beta_F$, uniaxial pore volume compressibility $c_{pu}$, depleted porosity $\Phi_{DP}$, depleted permeability $K_{DP}$, GMRS PERMOD Multiplier PMM, GMRS PERMOD Exponent PME, and GMRS BK factor BK.

In some example embodiments, a fracture conductivity principle may be applied on the identified variables 402 to generate intermediate variables 404 that are incorporated into one or more intermediate layers of the neural network 300. The fracture conductivity principle includes equations reproduced below to convert the identified variables to intermediate variables:

$$E' = \frac{E}{1-v^2} \quad (25)$$

$$w_{Frac} = 12.\pi.\frac{P_{net}}{E'}x_f \quad (26)$$

$$P_c = \sigma_{DP3} - (P_P - DP) + DD \quad (27)$$

$$\alpha_P = \alpha_B \frac{1-2.v}{1-v} \quad (28)$$

$$\sigma_{DP3} = \sigma_3 - \alpha_p.DP \quad (29)$$

$$k_{Prp} = s_1.e^{s_2.P_c} \quad (30)$$

$$k_{DPrp} = s_{D1}.e^{s_{D2}.P_c} \quad (31)$$

$$\beta_{Frac} = \frac{p_1}{k_{Frac}^{p_2}} \quad (32)$$

$$\beta_{Perf} = \frac{p_1}{k_{Perf}^{p_2}} \quad (33)$$

$$k_{Perf} = (1-\psi).k_{Prp} + \eta.k_{DPrp} \quad (34)$$

$$k_{Frac} = \frac{w_{Frac}}{w_{Mod}}k_{Perf} \quad (35)$$

$$BK_{Perf} = 1000.\beta_{Perf}.k_{Pref} \quad (36)$$

$$BK_{Frac} = 1000.\beta_{Frac}.k_{Frac} \quad (37)$$

where in the above equations (25) to (37), the probabilistic input variables, deterministic input variables, and intermediate variables generated by applying the fracture conductivity principle thereon are described in below table 1:

| Probabilistic Input Variables | | Intermediate Variables | |
|---|---|---|---|
| Drawdown | DD | Plane Strain Modulus | E' |
| Depletion | DP | Depletion Coefficient | $a_p$ |
| Poisson's Ratio | n | Depleted Minimum Principal Stress | $S_{DP3}$ |
| Young's Modulus | E | | |
| Net Pressure | $P_{net}$ | Closure Pressure | $P_c$ |
| Fracture Length | $x_f$ | Undamaged Proppant Permeability | $k_{Prp}$ |
| Minimum Principal Stress | $\sigma_3$ | | |
| Damaged pack percentage | $\Psi$ | Damaged Proppant Permeability | $k_{DPrp}$ |
| Biot's Constant | $\alpha_B$ | | |
| Deterministic Inputs Variables | | Fracture Width | $W_{Frac}$ |
| Initial Pore Pressure | PP | Formation Beta Factor | $b_{Frac}$ |
| Fracture Width in Model | $W_{Mod}$ | Perforation Tunnel Permeability | $k_{Perf}$ |
| Proppant Beta Factor Corr. Multiplier | $p_1$ | Fracture Permeability | $k_{Frac}$ |
| Proppant Beta Factor Corr. Exponent | $p_2$ | Perforation Tunnel GMRS BK Factor | $BK_{Perf}$ |
| Undamaged Prop. Perm. Coefficient | $s_1$ | Fracture GMRS BK Factor | $BK_{Frac}$ |
| Undamaged Prop. Perm. Multiplier | $s_2$ | | |
| Damaged Prop. Perm. Coefficient | $s_{D1}$ | | |
| Damaged Prop. Perm. Multiplier | $s_{D2}$ | | |

In some example embodiments, a perforation efficiency principle may be applied on the identified variables 402 to generate intermediate variables 404 that are incorporated into one or more intermediate layers of the neural network 300. The perforation efficiency conductivity principle includes equations reproduced below to convert the identified variables to intermediate variables:

$$\alpha_p = \alpha_B \frac{1-2.v}{1-v} \quad (38)$$

$$\sigma_{DP2} = \sigma_2 - \alpha_p.DP \quad (39)$$

$$\sigma_{DP3} = \sigma_3 - \alpha_p.DP \quad (40)$$

$$UCS_D = (1-\xi).UCS \quad (41)$$

$$HCS_D = hu_1.UCS_D + hu_2 \quad (42)$$

$$CF_S = 2.25.\left(\frac{hu_2}{UCS_D} + hu_1\right) \quad (43)$$

$$\eta = f(Az, Ic, DP, DD, P_p, \sigma_1, \sigma_{DP2}, \sigma_{DP3}, UCS, CF_S) \quad (44)$$

where in the above equations (38) to (44), the probabilistic inputs variables, deterministic inputs variables, and intermediate variables generated by applying the perforation efficiency principle thereon are described in below table 2:

| Probabilistic Inputs Variables | | Intermediate Variables | |
|---|---|---|---|
| Drawdown | DD | Depletion Coefficient | $\alpha_p$ |
| Depletion | DP | Depleted Intermediate Principal Stress | $\Sigma dp2$ |
| Poisson's Ratio | v | | |
| Well Azimuth to Principal Stress | Az | Depleted Minimum Principal Stress | $\sigma_{DP3}$ |
| Well Inclination to Principal Stress | Ic | Damaged Unconfined Compr. Strength | $UCS_D$ |
| Maximum Principal Stress | $\sigma_1$ | Hollow Cylinder Strength | $HCS_D$ |
| Intermediate Principal Stress | $\sigma_2$ | | |
| Minimum Principal Stress | $\sigma_3$ | Correlation F actor | $CF_S$ |
| Biot's Constant | $\alpha_B$ | Perforation Efficiency | n |
| Unconfined Compressive Strength | UCS | | |
| Fluid Invasion Strength Reduction | $\xi$ | | |
| Deterministic Inputs Variables | | | |
| Initial Pore Pressure | $P_P$ | | |
| HCS:UCS Slope | $hu_1$ | | |
| HCS:UCS Intercept | $hu_2$ | | |

In some example embodiments, a design matrix-fines migration principle may be applied on the identified variables 402 to generate intermediate variables 404 that are incorporated into one or more intermediate layers of the neural network 300. The design matrix-fines migration principle includes equations reproduced below to convert the identified variables to intermediate variables:

$$V_b = V * \phi \quad (45)$$

$$\overrightarrow{U_\alpha} = -\frac{Kk_\alpha}{\mu_\alpha}(\nabla p_\alpha - \gamma_\alpha \nabla D) \quad (46)$$

$$|U| = \sum_\alpha \sqrt{U_{\alpha,x}^2 + U_{\alpha,y}^2 + U_{\alpha,z}^2} \quad (47)$$

$$|q_\alpha| = \overrightarrow{U_\alpha} \cdot A_{inlet} \quad (48)$$

$$Q_\phi = \frac{\sum_k |q_\alpha|}{\phi * V_b} \quad (49)$$

$$\text{if } |U| \geq v_c \text{ then } M_k = (1-r)*e^{-b*Q_\phi} + r \quad (50)$$

where in the above equations (45) to (50), the probabilistic inputs variables, deterministic inputs variables, and intermediate variables generated by applying the design matrix-fines migration principle thereon are described in below table 3:

| Probabilistic Inputs Variables | | Intermediate Variables Variables | |
|---|---|---|---|
| Viscosity of phase α | $\mu_\alpha$ | Bulk Pore Volume | $v_b$ |
| Relative permeability of phase α | $k_\alpha$ | Velocity of phase α | $u_\alpha$ |
| Critical Velocity | $V_c$ | Total velocity | $|U|$ |
| Permeability reduction rate | b | Total flux of phase α | $q_\alpha$ |
| Residual Permeability | r | GMRS Pore Volume Throughput | $Q_\Phi$ |
| Deterministic Inputs Variables | | GMRS PERMMOD Multiplier | $M_K$ |
| Base Permeability | $k_b$ | Critical Velocity | $V_c$ |
| Base Porosity | $\Phi$ | | |

Figure 5:
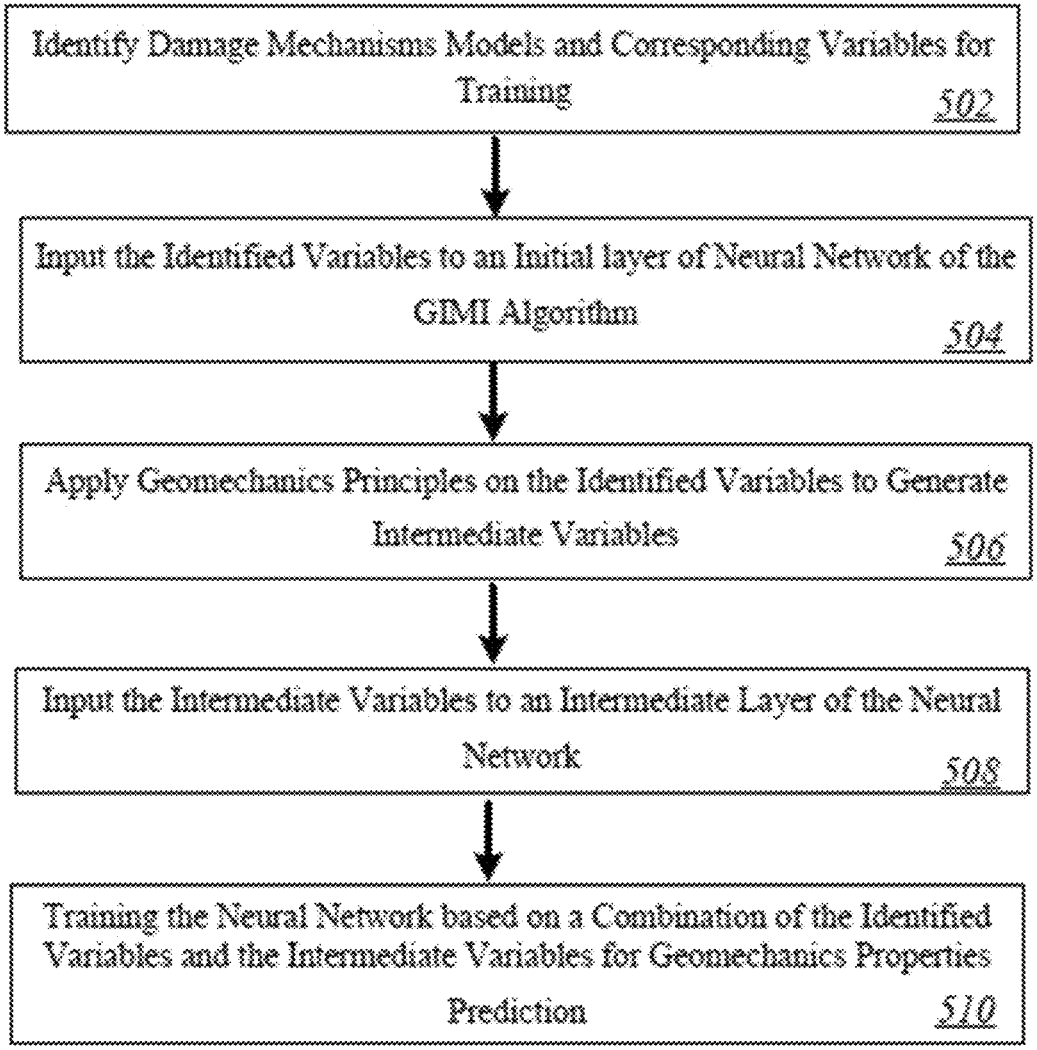
FIG. 5 is an example method flow for geomechanical performance training by a neural network of the GIMI framework.

FIG. 5 is an example method flow 500 for training the neural network 300 of the GIMI framework for predicting geomechanical performance of the hydrocarbon reservoir. Referring to FIGS. 1 and 2, and in an example embodiment, the method 500 includes identifying damage mechanism models and corresponding variables for ML algorithm training in the GIMI framework 108, at 502. For example, a GMRS tool may be used to identify the damage mechanisms that most significantly impact the predicted geomechanical performance of the hydrocarbon reservoir. The identified damage mechanisms also provide variables as input to the training of the ML algorithm 116 of the GIMI framework. In the training, the corresponding variables may be selected to present various production conditions of the reservoir. For the prediction of the productivity index decline, the identified damage mechanisms may include off-plane perforation contribution and stability. The corresponding variables may include unconfined compressive strength and well deviation. In this example, the identified damage mechanisms also include fracture connectivity and tortuosity with fracture to wellbore connection length identified as a corresponding variable. Additionally, the identified damage mechanisms for predicting productivity index decline may include drilling and completion fluids invasion. Respectively, the corresponding variables include formation permeability multiplier, near wellbore damage radius, and damage thickness around fracture. Further, the identified damage mechanisms include creep and compaction effects. The corresponding variables are Young's Modulus and creep percentage. The identified damage mechanisms also include fracture conductivity which identifies fracture length, net pressure, Young's Modulus, and proppant embedment as corresponding variables. Lastly, the identified damage mechanisms may include fines migration and trapping. The corresponding variables that are identified are formation permeability multiplier, wellbore damage radius, damage thickness around fracture, and perforation proppant permeability.

The method 500 also includes inputting the identified variables to the initial layer of the neural network 300 of the GIMI algorithm, at 504. For example, the identified variables, as described above, are input to the initial layer of the neural network 300 for training of the ML algorithm 116. As shown in FIGS. 3 and 4, the initial layer of the neural network 300 may only include classical neural net nodes that contain data. In addition, the method 500 includes applying geomechanics principles on the identified variables to generate intermediate variables. For example, to predict productivity index decline, geomechanics principles including the flow and transport principle, the equilibrium principle, the compaction and creep principle, the fracture conductivity principle, the perforation efficiency principle, and the design matrix-fines migration principle may be applied on identified input variables 402 to generate intermediate variables 404. The intermediate variables, here, may be different from the identified variables and in different scales. Further, the intermediate variables are input to at least one of the intermediate layers of the neural network 300, at 508, in order to incorporate geomechanics constraints, constitutive laws or material models into the training of the neural network 300. This helps improve the prediction accuracy of the resulting prediction model from the GIMI framework 106.

The training of the ML algorithm 116 of the GIMI framework 106 is conducted based on a combination of the identified variables and the intermediate variables, at 510. For examples, training of neural network 300 for models predicting productivity index decline are based on a combination of input variables 402 that are identified by the GMRS tool or are retrieved from field data of the reservoir. The intermediate variables 404 are generated by applying geomechanics principles on the identified variables and are incorporated to one or more intermediate layers of the neural network 300. The training of the neural network 300 takes a combination of the identified variables 402 and the generated intermediate variables 404 as a whole, for a supervised or a non-supervised training approach in the GIMI framework 106. At the end and after certain iterations of training of the ML algorithm 116, the GIMI framework 106 generates a prediction model for predicting geomechanical performance of the hydrocarbon reservoir.

Figure 6A:
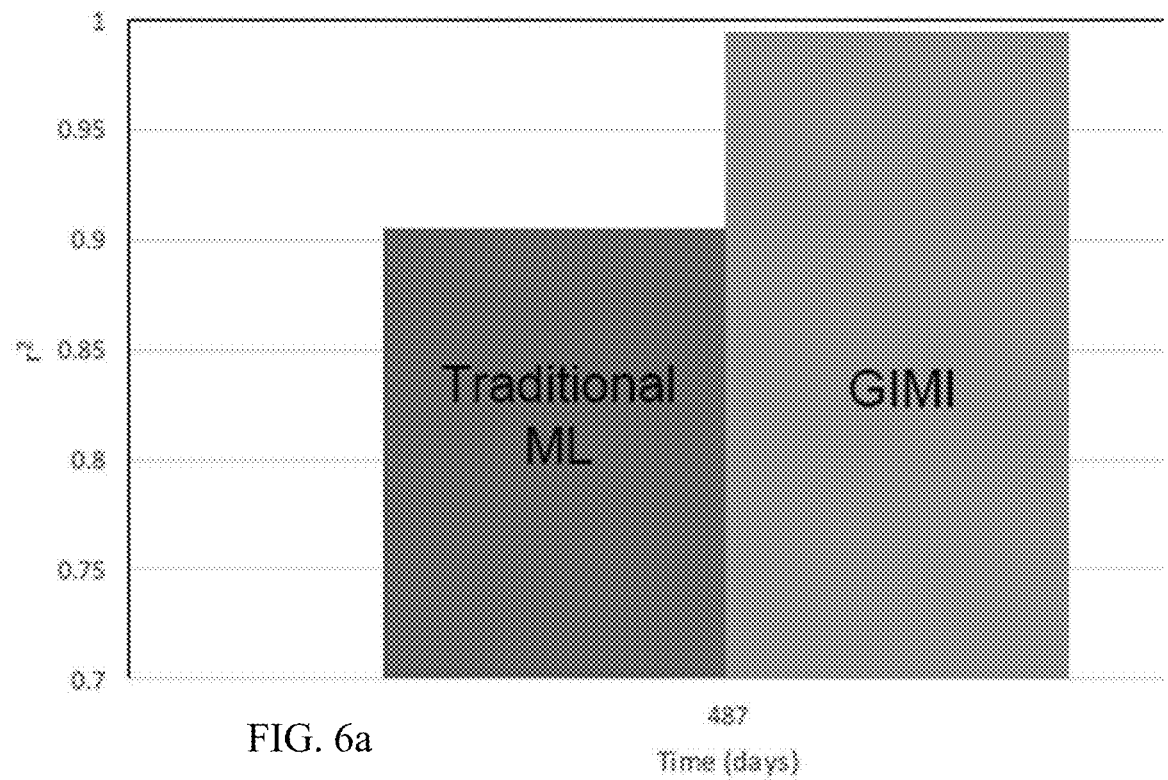
FIGS. 6a and 6b are comparisons of productivity index decline prediction accuracy calculated by the GIMI algorithm and traditional machine learning algorithms in various time periods.
Figure 6B:
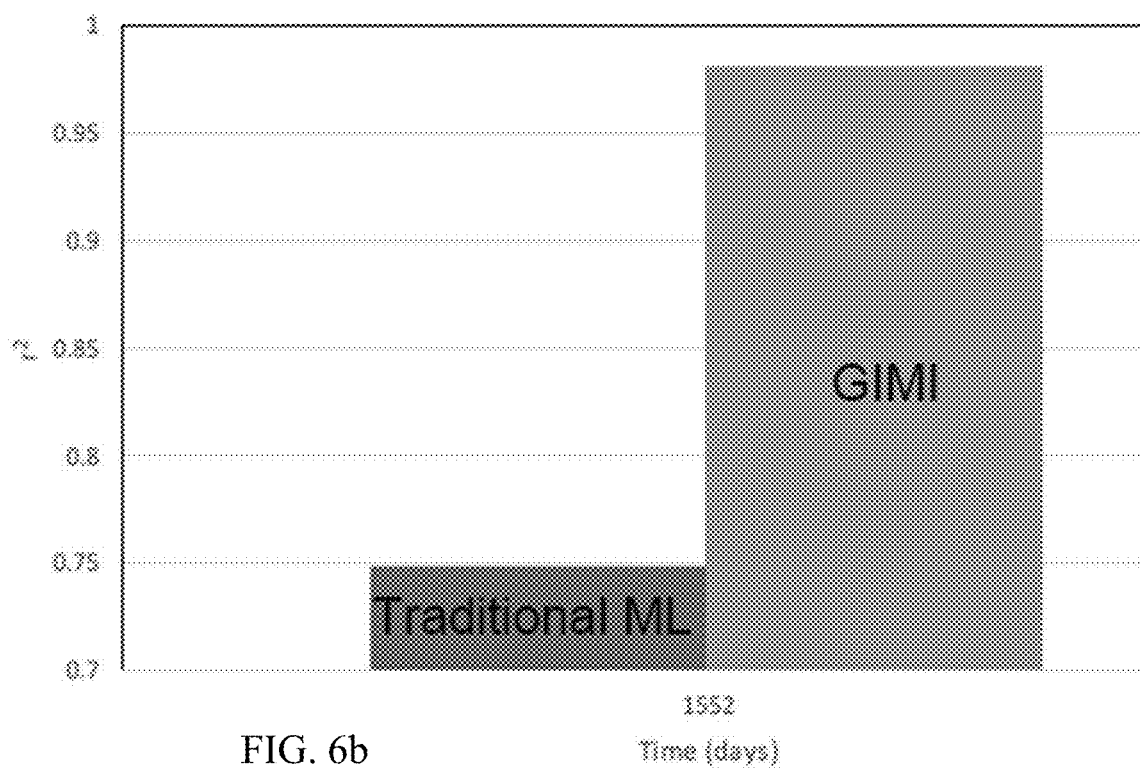

FIGS. 6a and 6b are comparisons of productivity index decline prediction accuracies calculated by the GIMI algorithm and traditional machine learning model in various time periods. In these example embodiments, the traditional machine learning model consists of supervised algorithms used to predict the productivity index decline. The supervised ML algorithms are based solely on data and heavily impacted by noise presented in its training dataset. In contrast, the GIMI algorithms introduced in this application are trained based on a combination of identified variables and intermediate variables, where the identified variables are input to the initial layer of the neural network and the intermediate variables are incorporated into at least one of the intermediate layers of the neural network. The intermediate variables are generated by applying geomechanics principles on the identified variables and are incorporated to at least one the intermediate layers of the neural network to improve the geomechanical performance prediction accuracy. As shown in the interpolation comparison of FIG. 6a, the GIMI algorithm presents a higher $r^2$ statistical value close to 0.99 as compared to that of the traditional supervised ML algorithm which has a lower $r^2$ statistical value of 0.9, for a blind prediction of a 487 day production period for the reservoir. In addition, as shown in the extrapolation comparison of FIG. 6b, the GIMI algorithm presents a higher $r^2$ statistical value close to 0.98 compared to that of the traditional supervised ML algorithm which has a lower $r^2$ statistical value of 0.75, for a blind prediction of a 1552 day production period for the reservoir.

The comparisons of prediction accuracies of the GIMI algorithm and traditional ML algorithm reveal that the trained GIMI algorithm described in this application is significantly better than the traditional ML approach in predicting the productivity index decline of the hydrocarbon reservoir. As a physics informed ML algorithm, the GIMI approach has shown to be less data-hungry, easier to train, less prone to common ML training issues such as over/under fitting, and lower predictive uncertainty.

Figure 7:
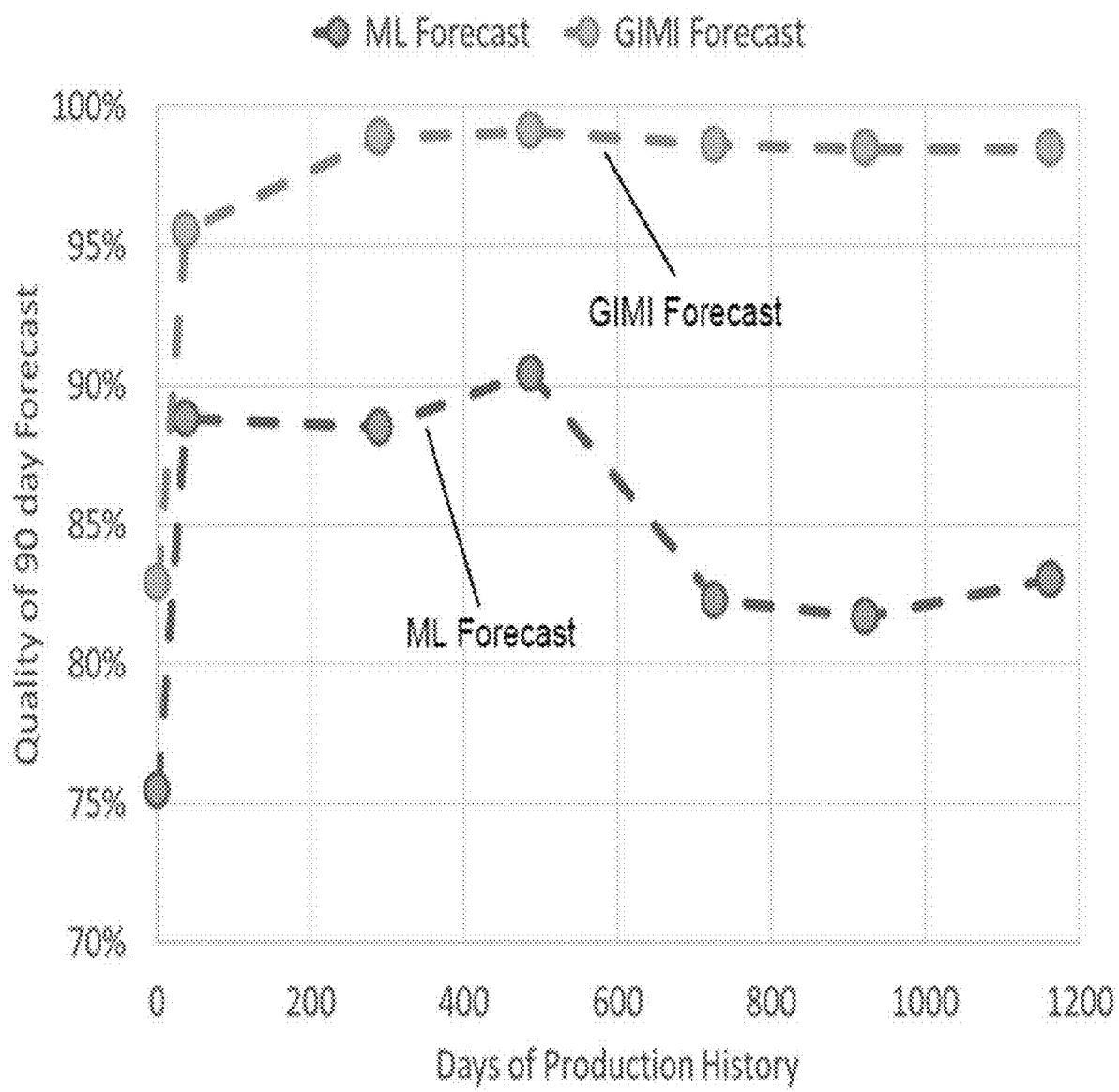
FIG. 7 illustrates a prediction accuracy comparison of productivity index decline in a 90-day forecast by using the GIMI algorithm and the traditional ML algorithm.

FIG. 7 illustrates a prediction accuracy comparison of productivity index decline in a 90-day forecast by using the GIMI algorithm and the traditional ML algorithm. This figure plots curves of the prediction accuracy of each ML algorithm at $1^{st}$, $38^{th}$, $290^{th}$, $487^{th}$, $727^{th}$, $923^{rd}$, and $1162^{nd}$ days after initiation of oil production in the hydrocarbon reservoir. For data points corresponding to each of the days, the GIMI approach reveals an at least 10% higher prediction accuracy than that of the traditional ML algorithm approach. For example, at a $1^{st}$ day of the reservoir production, the GIMI algorithm approach presents an 84% prediction accuracy and the traditional ML algorithm approach presents a 75% prediction accuracy for predicting the productivity index decline. Similarly, at a $1162^{nd}$ day of the reservoir production, the GIMI algorithm approach presents a 98% prediction accuracy and the traditional ML algorithm approach presents an 83% prediction accuracy for predicting the productivity index decline. The engineering team for the reservoir may utilize the GIMI algorithm to generate a prediction model in predicting the reservoir production index decline, and further link this GIMI approach to a digital oil field and GAP to assess the impact of short term production alteration to the production schedule of the productivity index decline.

Figure 8:
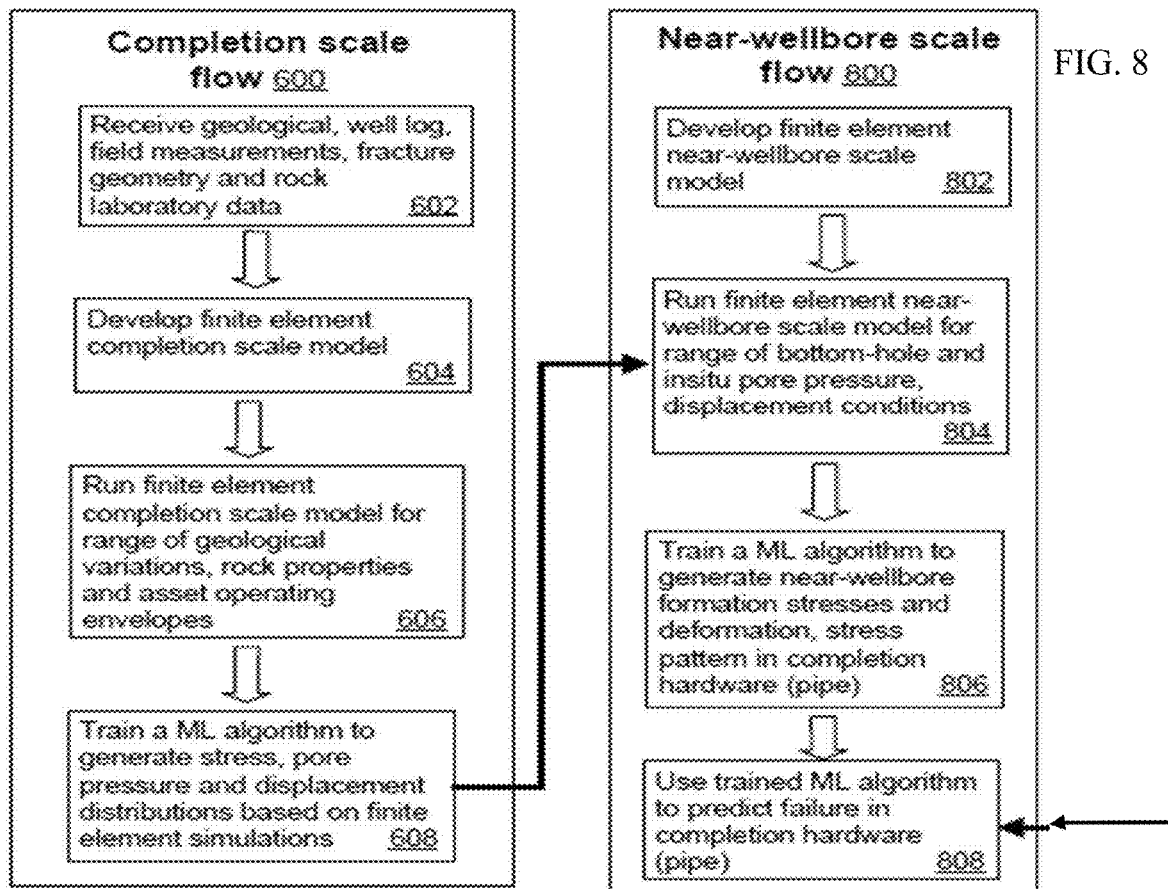
FIG. 8 illustrates example method flows for well completion integrity prediction by the GIMI algorithm.
Figure 8:
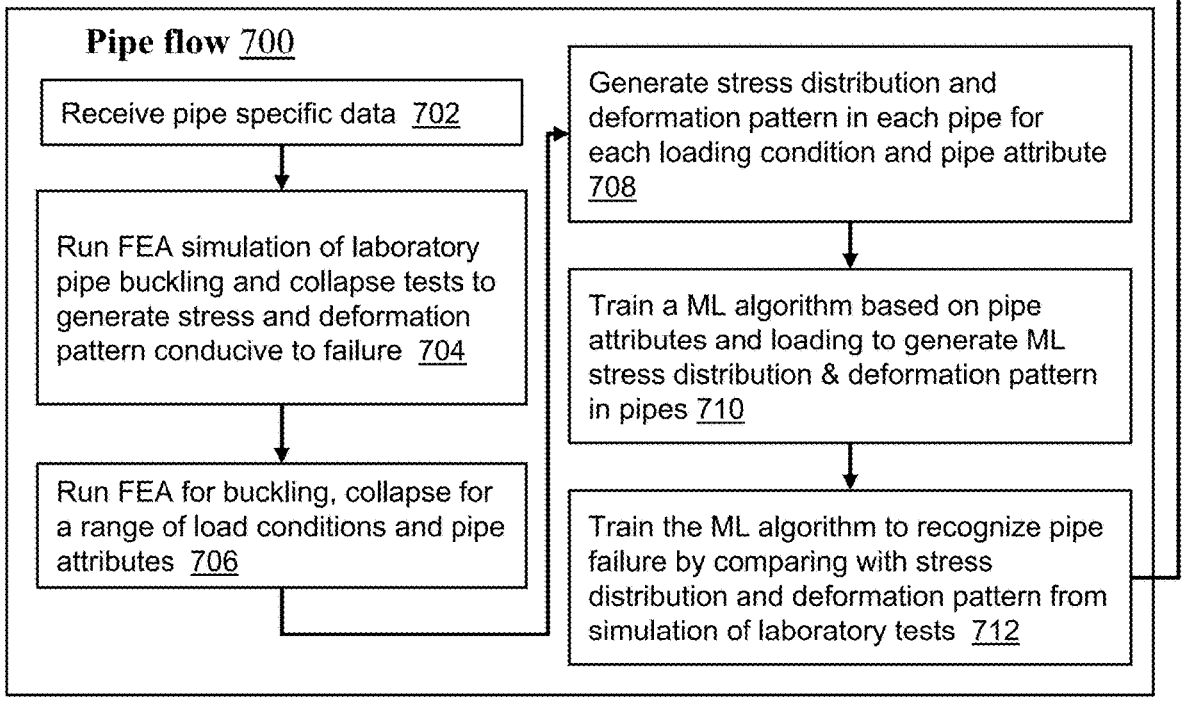

The productivity index decline is a common issue in many reservoirs. To obtain a highly reliable production forecast, it is critical to include well and completion performance in the analysis. The aforementioned GIMI algorithm can be applied to areas of geomechanics applications such as prediction of well component integrity, assessing pressure limits while injecting water into oil reservoirs for improved production, fault movement analyses, hydraulic fracturing optimization in unconventional reservoirs, accelerated fracture simulations, predicting erosion of sand control screens in conventional reservoirs, and optimizing well performance. In the case of well integrity applications, FIG. 8 reveals example method flows 600, 700, and 800 for completion integrity prediction by the GIMI algorithm. These example method flows include a completion scale flow 600, a pipe flow 700, and a near-wellbore scale flow 800. Each of the completion scale flow 600 and the pipe flow 700 provide their flow outputs to be incorporated into steps of the near-wellbore scale flow 800.

In an example embodiment, the completion scale flow 600 includes receiving geological data, well log data, field measurements data, fracture geometry data, and rock laboratory data, at 602. For example, the method 600 may retrieve the geological data and log data from field data of the hydrocarbon reservoir or pull data out from database that is connected to the digital oil field. The method 600 also includes developing a finite element completion scale model, at 604. The finite element completion scale model may be generated by using GMRS/Abaqus/Parageo or other finite element based tools and incorporating changes in subsurface stresses, pore pressure, and damage mechanisms that are related to the completion scale. Further, the method 600 includes running the finite element completion scale model for a range of geological variations, rock properties, and asset operating envelopes, at 606. In this step, the finite element completion scale model is being utilized to simulate corresponding completion scales as functions of various input variations to generate finite well completion training data. Lastly, the method 600 includes training a ML algorithm to generate stress, pore pressure, and displacement distributions based on the finite element simulations. For example, the GIMI framework 106 may use the well completion training data to train the ML algorithm 116.

In an example embodiment, the pipe flow 700 includes receiving pipe specific data, at 702. For example, pipe specific data may be collected from the technical manual distributed by a manufacturer of the pipe. The pipe flow 700 also includes running a finite element analysis (FEA) simulation of laboratory pipe buckling and collapse tests to generate stress and deformation patterns conducive to failure, at 704. For example, experiments can be conducted on the laboratory pipe by varying the stress applied on the pipe and monitoring deformation patterns as functions of applied stress. Additionally, the pipe flow 700 includes running FEA simulation for buckling and collapse for a range of load conditions and pipe attributes. In this step, FEA simulation is conducted to observe the buckling and collapse performance of the laboratory pipe by varying the load conditions and changing the pipe attributes. Further, the pipe flow 700 includes generating stress distribution and deformation pattern in each pipe for each loading condition and pipe attribute, at 708. In this step, a stress distribution and deformation pattern is generated based on the FEA simulation results collected in step 706 as functions of various loading condition and pipe attributes. Here, the FEA simulation is performed for a hardware used in the well completion to generate the hardware training data. Moreover, the pipe flow 700 includes training a ML algorithm based on pipe attributes and loading conditions to generate ML stress distribution and deformation patterns in the pipe, at 710. Here, the generated input variables including loading conditions and pipe attributes, as well as the generated stress distribution and deformation patterns of the pipe are used for training datasets and are input to train the ML algorithm in predicting pipe failures. Lastly, the method 712 includes training the ML algorithm described in step 710 to recognize pipe failure by comparing with stress distribution and deformation patterns from simulation of laboratory tests. In this step, the ML algorithm is further trained so as to fit to the FEA simulation results described in step 704. Specifically, the GIMI algorithm is trained using the hardware training data and physical models for the hardware.

In an example embodiment, the near-wellbore scale flow 800 includes developing a finite element near-wellbore scale model, at 802. The near-wellbore scale model may be generated by software or the GMRS tool, and contain variables responding to the near-wellbore scale. The near-wellbore scale flow 800 also includes running a finite element near-wellbore scale model for a range of bottom-hole and in-situ pore pressure, and a range of displacement conditions, at 804. In this step, variables of bottom-hole pressure, in-situ pore pressure, and displacement conditions are input to the finite element near-wellbore scale model for simulation. The simulation generates a range of near-wellbore scales as functions of the input variables. The simulation results also generate training data for conditions surrounding the well completion. The near-wellbore scale flow 800 further includes training a ML algorithm to generate near-wellbore formation stresses and deformation, as well as stress patterns in completion hardware, e.g., the pipe, at 806. Here, the simulated near-wellbore scales and corresponding input variables are utilized as a training dataset to train the ML algorithm in predicting the near-wellbore formation stresses and deformation, and stress patterns in completion hardware, e.g., the pipe. Lastly, the near-wellbore scale flow 800 includes using the trained ML algorithm to predict failure in the completion hardware, for example, the pipe, at 808. Once the training of the ML algorithm is completed, for example, the prediction accuracy of resulting physical model is higher than a threshold value, the ML algorithm is ready for predicting failure in the hardware used in the well completion.

Figure 9:
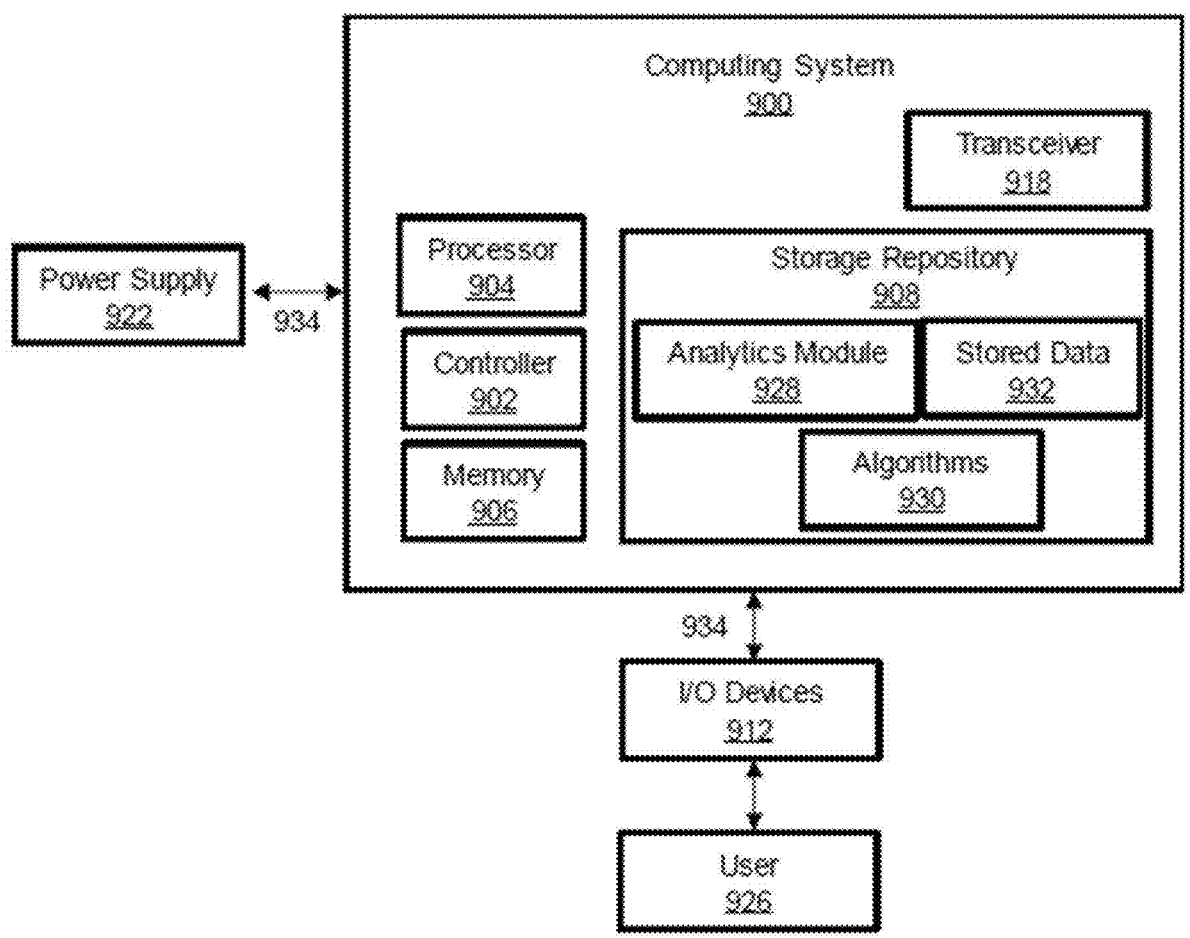
FIG. 9 illustrates a block diagram of an example system for geomechanical performance prediction by the GIMI algorithm.

FIG. 9 is a block diagram of an example system 900 for geomechanical performance prediction by the GIMI algorithm. The system 900 comprises a computer 900 with a controller 902, a processor 904, a memory 906, a transceiver 918 and a storage repository 908 which can comprise an analytics software module 928, stored data 932, and algorithms 930. The transceiver 918 can send and receive data. The analytics software module 928 can be implemented as computer readable instructions stored in memory. The analytics software module 928 can perform the methods described herein and can render a graphical user interface in the form of a geomechanical performance prediction analytics dashboard described in connection with FIGS. 1-8. Input and Output devices 912 are connected to the computer 900 through wired or wireless means 934. The computer 900 can receive power from a power supply 922. A bus (not shown) can allow the various components and devices to communicate with one another. A bus can be one or more of any of several types of bus structures, including a memory bus or memory controller, a peripheral bus, an accelerated graphics port, and a processor or local bus using any of a variety of bus architectures. A bus can include wired and/or wireless buses. The components shown in FIG. 9 are not exhaustive, and in some embodiments, one or more of the components shown in FIG. 9 may not be included in a specific embodiment. Further, one or more components shown in FIG. 9 can be rearranged. It should also be understood that in embodiments, the various elements shown here can be located together or located remotely from each other. For example, the storage repository could be stored in a different location, such as on a server, from the processor used by the computing system.

Various techniques are described herein in the general context of software. Generally, software includes routines, programs, objects, components, data structures, and so forth that perform particular tasks or implement particular abstract data types. An implementation of these modules and techniques can be stored on or transmitted across some form of computer readable media. Computer readable media is any available non-transitory medium or non-transitory media that is accessible by a computing device. By way of example, and not limitation, computer readable media includes computer storage media.

Systems of the disclosure can include an intranet-based computer system that is capable of communicating with various software. A computer system includes any type of computing device and/or communication device. Examples of such a system can include, but are not limited to, super computers, a processor array, a distributed parallel system, a desktop computer with LAN, WAN, Internet or intranet access, a laptop computer with LAN, WAN, Internet or intranet access, a smart phone, a server, a server farm, an android device (or equivalent), a tablet, smartphones, and a personal digital assistant (PDA). Further, as discussed above, such a system can have corresponding software (e.g., graphical user interface software, analytics software). The software of one system can be a part of, or operate separately but in conjunction with, the software of another system.

Embodiments of the disclosure include a storage repository. The storage repository can be a persistent storage device (or set of devices) that stores software and data. Examples of a storage repository can include, but are not limited to, a hard drive, flash memory, some other form of solid-state data storage, or any suitable combination thereof. The storage repository can be located on multiple physical machines, each storing all or a portion of a database, protocols, algorithms, software modules, and/or other stored data according to some example embodiments. Each storage unit or device can be physically located in the same or in a different geographic location. In embodiments, the storage repository may be stored locally, or on cloud-based servers such as Amazon Web Services.

In one or more example embodiments, the storage repository stores one or more databases, AI Platforms, protocols, algorithms, software modules, and stored data. The protocols can include any of a number of communication protocols that are used to send and/or receive data between the processor, datastore, memory and the user. A protocol can be used for wired and/or wireless communication. Examples of protocols can include, but are not limited to, Modbus, profibus, Ethernet, and fiberoptic.

Systems of the disclosure can include a hardware processor. The processor executes software, algorithms, and firmware in accordance with one or more example embodiments. The processor can be a central processing unit, a multi-core processing chip, SoC, a multi-chip module including multiple multi-core processing chips, or other hardware processor in one or more example embodiments. The processor is known by other names, including but not limited to a computer processor, a microprocessor, and a multi-core processor. The processor can also be an array of processors.

In one or more example embodiments, the processor executes software instructions stored in memory. Such software instructions can include performing analysis on data received from the database and so forth. The memory includes one or more cache memories, main memory, and/or any other suitable type of memory. The memory can include volatile and/or non-volatile memory.

The processing system can be in communication with a computerized data storage system which can be stored in the storage repository. The data storage system can include a non-relational or relational data store, such as a MySQL or other relational database. Other physical and logical database types could be used. The data store may be a database server, such as Microsoft SQL Server, Oracle, IBM DB2, SQLITE, or any other database software, relational or otherwise. The data store may store the information identifying syntactical tags and any information required to operate on syntactical tags. In some embodiments, the processing system may use object-oriented programming and may store data in objects. In these embodiments, the processing system may use an object-relational mapper (ORM) to store the data objects in a relational database. The systems and methods described herein can be implemented using any number of physical data models. In one example embodiment, an RDBMS can be used. The tables of the RDBMS can have pre-defined relationships between them.

In embodiments, the systems of the disclosure can include one or more I/O (input/output) devices that allow a user to enter commands and information into the system, and also allow information to be presented to the user and/or other components or devices. Examples of input devices include, but are not limited to, a keyboard, a cursor control device (e.g., a mouse), a microphone, a touchscreen, and a scanner. Examples of output devices include, but are not limited to, a display device (e.g., a display, a monitor, or projector), speakers, a printer, and a network card.

For any figure shown and described herein, one or more of the components may be omitted, added, repeated, and/or substituted. Accordingly, embodiments shown in a particular figure should not be considered limited to the specific arrangements of components shown in such figure. Further, if a component of a figure is described but not expressly shown or labeled in that figure, the label used for a corresponding component in another figure can be inferred to that component. Conversely, if a component in a figure is labeled but not described, the description for such component can be substantially the same as the description for the corresponding component in another figure.

Terms such as "first" and "second" are used merely to distinguish one component (or part of a component or state of a component) from another. Such terms are not meant to denote a preference or a particular orientation, and are not meant to limit the embodiments described herein. In the example embodiments described herein, numerous specific details are set forth in order to provide a more thorough understanding of the embodiments. However, it will be apparent to one of ordinary skill in the art that the embodiments may be practiced without these specific details. In other instances, well-known features have not been described in detail to avoid unnecessarily complicating the description.

Although particular embodiments have been described herein in detail, the descriptions are by way of example. The features of the embodiments described herein are representative and, in alternative embodiments, certain features, elements, and/or steps may be added or omitted. Additionally, modifications to aspects of the embodiments described herein may be made by those skilled in the art without departing from the scope of the following claims, the scope of which are to be accorded the broadest interpretation so as to encompass modifications and equivalent structures.

What is claimed is:

1. A computer implemented method for prediction of productivity index decline for a hydrocarbon reservoir using a geomechanics informed machine learning (GIML) model, the method comprising:
   performing geomechanical reservoir simulations to generate training datasets for the hydrocarbon reservoir;
   incorporating identified variables into an initial layer of a neural network of the GIML model and intermediate variables into at least one intermediate layer of the neural network of the GIML model, wherein the intermediate variables are generated by applying total stress, strain-displacement, and elastic stress-strain calculations to the identified variables;
   training the neural network of the GIML model with correlated training datasets that correlate to the physical models to produce a resulting prediction model, wherein the correlated training datasets are a subset of the training datasets, and wherein the training comprises training the initial layer of the neural network with the identified variables and training the at least one intermediate layer of the neural network with the intermediate variables;
   performing sensitivity analysis on the resulting prediction model;
   identifying dominant variables for damage mechanisms through design of experiment (DOE), wherein the damage mechanisms relate to the productivity index decline for the hydrocarbon reservoir;
   performing history matching and blind test on the resulting prediction model;
   predicting the productivity index decline for the hydrocarbon reservoir using the resulting prediction model; and
   updating, based on an accuracy of the prediction of the productivity index decline being less than a threshold value, the identified variables and the intermediate variables incorporated into the GIML model.

2. The computer implemented method of claim 1, wherein the GIML model is configured to calculate a productivity decline curve for each combination of the identified variables and the intermediate variables.

3. The computer implemented method of claim 1, wherein the intermediate variables are further generated by applying to the identified variables geomechanics principles that comprise flow and transport principles, compaction and creep principles, fracture conductivity principles, perforation efficiency principles, and fines migration principles.

4. The computer implemented method of claim 1, wherein the physical models are for prediction of the productivity index decline and comprise a fully coupled flow and geomechanics model used to simulate damage mechanisms during production of the hydrocarbon reservoir.

5. The computer implemented method of claim 4, wherein the damage mechanisms comprise off-plane perforation contribution and stability, fracture connectivity and tortuosity, drilling and completion fluids invasion, creep and compaction effects, fracture conductivity, and fines migration and trapping.

6. The computer implemented method of claim 1, wherein the identified variables are propagated through layers of the neural network of the GIML model to incorporate material models.

7. The computer implemented method of claim 1, wherein the history matching is performed between field data for the hydrocarbon reservoir and the resulting prediction model, wherein the history matching generates results for identifying the variables and the physical models that have a larger impact on performance of the hydrocarbon reservoir then other variables.

8. A computer implemented method for predicting a geomechanical characteristic of a hydrocarbon reservoir using a geomechanics informed machine learning (GIML) model, the method comprising:
   performing geomechanical reservoir simulations to generate training data;
   incorporating identified variables into an initial layer of a neural network of the GIML model-and intermediate variables into at least one intermediate layer of the neural network of the GIML model, wherein the intermediate variables are generated by applying total stress, strain-displacement, and elastic stress-strain calculations to the identified variables;
   training the neural network of the GIML model with correlated training data that correlates to the physical models to produce a resulting prediction model, wherein the correlated training data is a subset of the training data, and wherein the training comprises training the initial layer of the neural network with the identified variables and training the at least one intermediate layer of the neural network with the intermediate variables;
   performing sensitivity analysis and history matching on the resulting prediction model;
   predicting the geomechanical characteristic of the hydrocarbon reservoir using the resulting prediction model;
   evaluating an accuracy of the geomechanical characteristic predicted using the resulting prediction model; and
   updating the physical models based on the accuracy.

9. The computer implemented method of claim 8, wherein training the neural network of the GIML model further comprises propagating the identified variables through layers of the neural network to incorporate material models.

* * * * *